(12) United States Patent
Chiu et al.

(10) Patent No.: US 12,733,529 B2
(45) Date of Patent: Sep. 8, 2026

(54) BUMP STRUCTURE AND METHOD OF MAKING THE SAME

(71) Applicant: TAIWAN SEMICONDUCTOR MANUFACTURING COMPANY, LTD., Hsinchu (TW)

(72) Inventors: Bo-Yu Chiu, Taoyuan City (TW); Pei-Wei Lee, Pingtung County (TW); Fu Wei Liu, Tainan (TW); Yun-Chung Wu, Taipei City (TW); Hao Chun Yang, New Taipei City (TW); Chin-Yu Ku, Hsinchu City (TW); Ming-Da Cheng, Taoyuan (TW); Mirng-Ji Lii, Sinpu Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 573 days.

(21) Appl. No.: 18/123,794

(22) Filed: Mar. 20, 2023

(65) Prior Publication Data

US 2024/0047397 A1 Feb. 8, 2024

Related U.S. Application Data

(60) Provisional application No. 63/394,890, filed on Aug. 3, 2022.

(51) Int. Cl.

*H10W 72/20* (2026.01)
*H10W 72/00* (2026.01)

(Continued)

(52) U.S. Cl.

CPC ...... *H10W 72/20* (2026.01); *H10W 72/01208* (2026.01); *H10W 72/281* (2026.01);

(Continued)

(58) Field of Classification Search

CPC ... H10W 72/20; H10W 72/29; H10W 72/232; H10W 72/923; H10W 72/983

See application file for complete search history.

(56) References Cited

U.S. PATENT DOCUMENTS 6,054,389 A * 4/2000 Cheng .............. H01L 21/76885 438/692
7,977,783 B1 * 7/2011 Park ....................... H01L 24/11 257/E29.325

(Continued)

FOREIGN PATENT DOCUMENTS

DE 10-2020-129570 A1 9/2021
KR 10-2006-0064289 A 6/2006

(Continued)

*Primary Examiner* — Julio J Maldonado
*Assistant Examiner* — Pinaki Das
(74) *Attorney, Agent, or Firm* — STUDEBAKER BRACKETT PLLC

(57) ABSTRACT

A semiconductor device includes a substrate, one or more wiring layers disposed over the substrate, a passivation layer disposed over the one or more wiring layers, a first conductive layer disposed over the passivation layer, a second conductive layer disposed over the first conductive layer, an isolation structure formed in the first and second conductive layers to isolate a part of the first and second conductive layers, and a first metal pad disposed over the isolation structure and the part of the first and second conductive layers. In one or more of the foregoing or following embodiments, the semiconductor device further includes a second metal pad disposed over the second conductive layer and electrically isolated from the first metal pad.

20 Claims, 35 Drawing Sheets

(51) Int. Cl.
*H10W 72/29* (2026.01)
*H10W 72/90* (2026.01)

(52) U.S. Cl.
CPC .......... *H10W 72/29* (2026.01); *H10W 72/923* (2026.01); *H10W 72/952* (2026.01); *H10W 72/983* (2026.01)

(56) References Cited

U.S. PATENT DOCUMENTS

| | | | | |
|---|---|---|---|---|
| 11,417,539 | B2 | 8/2022 | Lu et al. | |
| 12,033,870 | B2 | 7/2024 | Lu et al. | |
| 2006/0121721 | A1 | 6/2006 | Lee et al. | |
| 2012/0217374 | A1 | 8/2012 | Nishizawa | |
| 2016/0079191 | A1* | 3/2016 | Chen | H01L 24/19 257/773 |
| 2016/0133546 | A1 | 5/2016 | Yang | |
| 2016/0190089 | A1* | 6/2016 | Yu | H01L 24/81 438/107 |
| 2021/0272819 | A1* | 9/2021 | Lu | C25D 7/123 |
| 2022/0020774 | A1 | 1/2022 | Chia et al. | |

FOREIGN PATENT DOCUMENTS

| | | | |
|---|---|---|---|
| KR | 10-2021-0110175 | A | 9/2021 |
| TW | 202203219 | A | 1/2022 |

* cited by examiner

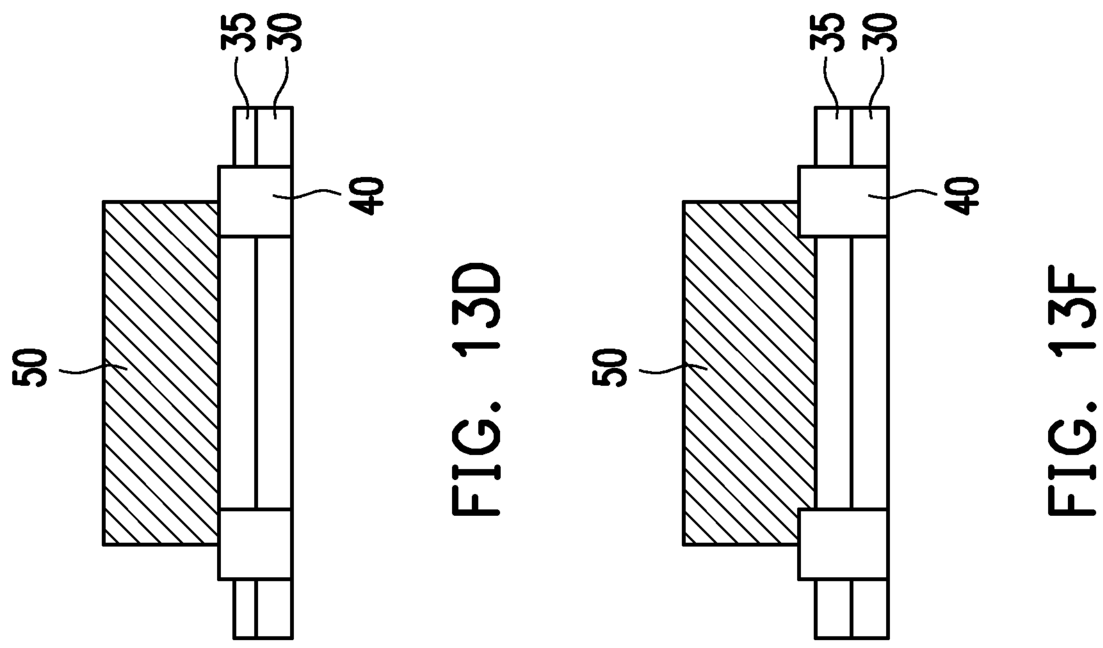
FIG. 13D
FIG. 13F
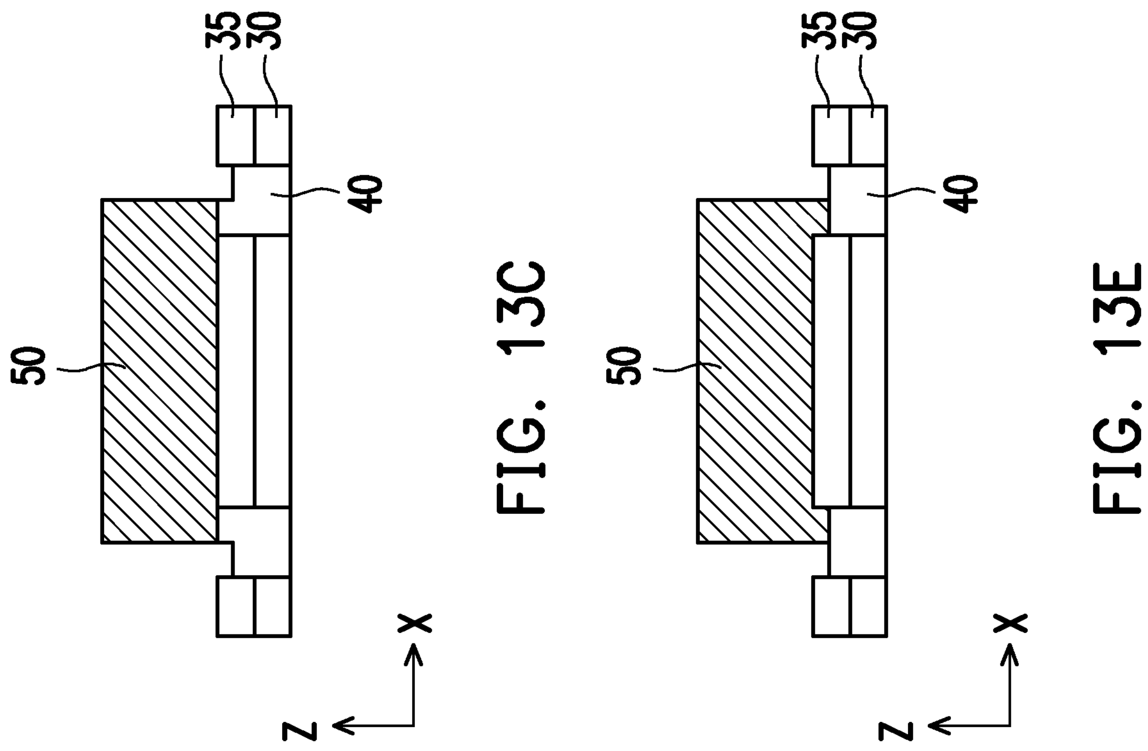
FIG. 13C
FIG. 13E 25
15
10
40
20

X
Z
25
15
10
20
40L

X
Z

BUMP STRUCTURE AND METHOD OF MAKING THE SAME

RELATED APPLICATIONS

This application claims priority to U.S. Provisional Patent Application No. 63/394,890 filed Aug. 3, 2022, the entire contents of which are incorporated herein by reference.

BACKGROUND

As consumer devices with ever better performance have gotten smaller and smaller in response to consumer demand, the individual components of these devices have necessarily decreased in size as well. Semiconductor devices, which make up major components of consumer devices such as mobile phones, computer tablets, and the like, have become smaller and smaller. The decrease in size of semiconductor devices has been met with advancements in semiconductor manufacturing techniques such as forming connections between semiconductor device and another device, such as a micro electro mechanical system (MEMS).

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 13C, 13D, 13E and 13F show one of the stages of a sequential manufacturing operation of a semiconductor device according to embodiments of the present disclosure.

DETAILED DESCRIPTION

Figure 1B:
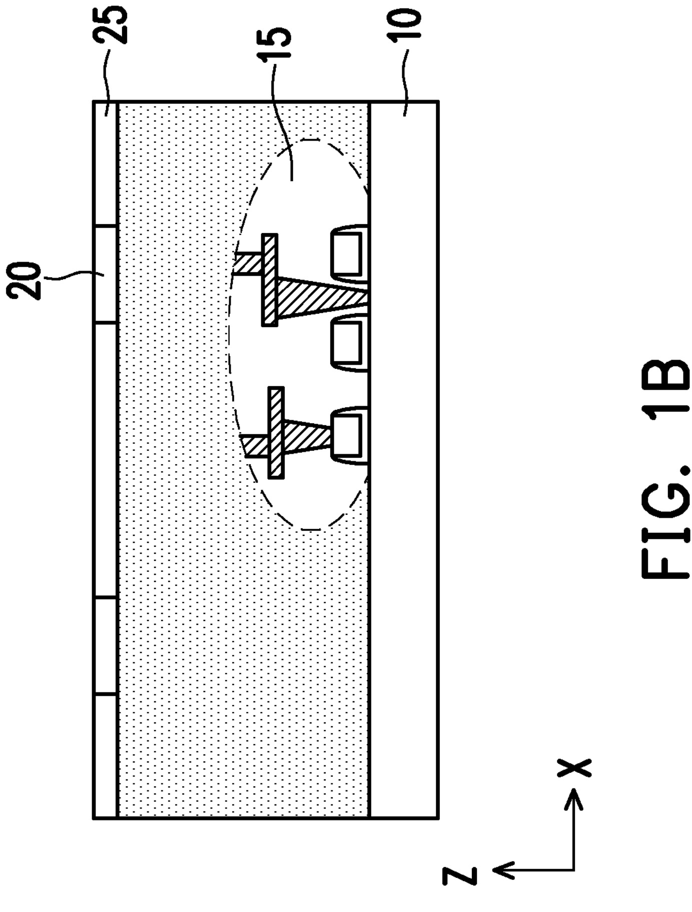
FIGS. 1A and 1B show one of the stages of a sequential manufacturing operation of a semiconductor device according to an embodiment of the present disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Materials, methods, processes, dimensions and/or configuration of one embodiment can be applied to one or more other embodiments, and the detailed description thereof may be omitted.

As the electronic industry develops three-dimensional integrated circuits (3D IC), the processing and reliability of bumps or bump electrodes, which are used to interconnect the stacked chips and/or a semiconductor chip and a MEMS, is being actively investigated. In the course of reduction in size of the bumps, the diameter of a bump is reduced to about one order of magnitude smaller than that of flip chip solder joints, and the volume is about 1000 times smaller. The much smaller size of the solder joints increases the possibility of failure of the bump solder joints.

Bumps are generally formed over a conductive layer and are electrically isolated from each other where necessary. More reliable isolation structure for the bumps have been required. In the present disclosure, a novel technology to form bump structures that can provide a more reliable isolation structure and a more process friendly structures is provided.

FIGS. 1A and 1B to 20A and 20B show various views of a sequential manufacturing operation of a bump structure over a semiconductor circuit according to an embodiment of the present disclosure. It is understood that additional operations can be provided before, during, and after processes shown by FIGS. 1A-20B, and some of the operations described below can be replaced or eliminated, for additional embodiments of the method. The order of the operations/processes may be interchangeable. In FIGS. 1A and 1B to 20A and 20B, the "A" figures show a plan view (a top view or a projected view) and the "B" figures show a cross sectional view along line A-A of the "A" figures.

Figure 1A:
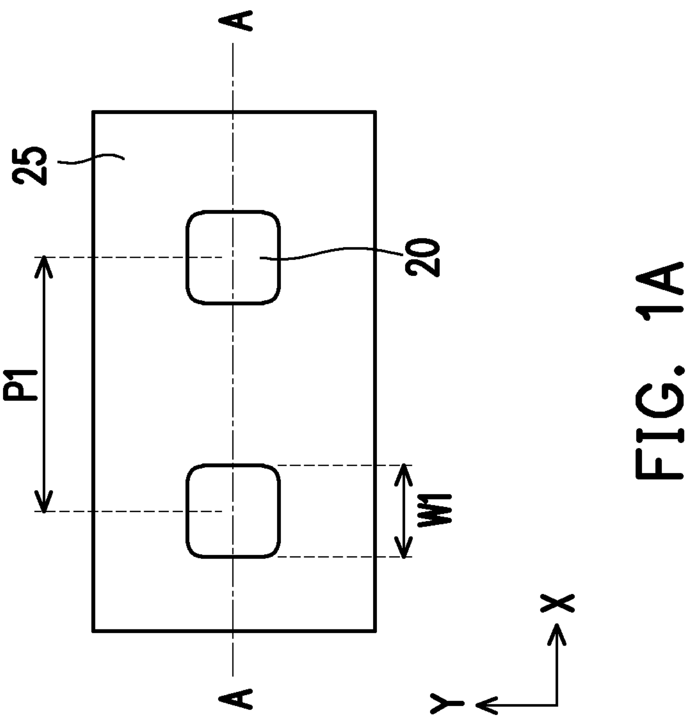

As shown in FIGS. 1A and 1B, a plurality of pad electrodes 20, on which bump structures are to be formed, are arranged over a semiconductor circuit 15 formed on a substrate 10. In some embodiments, the pad electrodes 20 are formed in a passivation layer 25. The pad electrodes 20 are formed of a suitable conductive metal, including aluminum, copper, silver, gold, nickel, tungsten, titanium, alloys thereof, and/or multilayers thereof. The pad electrodes 20 are formed by a suitable metal deposition operation, including electro or electroless plating, physical vapor deposition (PVD) including sputtering, chemical vapor deposition (CVD), atomic layer deposition (ALD), thermal evaporation, or electron beam evaporation. The pad electrodes 20 are arranged in a row-column arrangement in some embodiments.

In some embodiments, the semiconductor circuit 15 includes transistors (e.g., field effect transistors (FETs)), capacitors, inductors, resistors, or the like in some embodiments. The pad electrodes 20 are electrically coupled to the semiconductor circuit 15 through underlying interconnection layers including wiring layers and vias formed in dielectric layers, such as an interlayer dielectric (ILD) layer or an intermetal dielectric (IMD) layer in some embodiments. The wiring layers and vias of the interconnection layer may be formed of copper or copper alloys (e.g., AlCu), aluminum, tungsten, nickel, or any other suitable metal. The wiring layers and vias may be formed using damascene processes.

In some embodiments, the pad electrodes 20 have a width W1 ranging from about 10 μm to about 500 μm as seen in plan view. In other embodiments, the pad electrodes 20 have the width W1 ranging from about 20 μm to about 100 μm. In some embodiments, the plurality of pad electrodes 20 are arranged in a row-column arrangement having a pitch P1 of about 20 μm to about 100 μm. In some embodiments, the pitch along the X direction is the same as or different from the pitch along the Y direction. In some embodiments, the thickness of the pad electrode 20 is in a range from about 0.5 μm to about 15 μm and is in a range from about 1 μm to about 10 μm in other embodiments.

A 1×2 arrangement of the pad electrodes 20 is illustrated, but the disclosure is not limited to a 1×2 arrangement. Other arrangements, including a fewer or greater number of rows or columns of pad electrodes 20 are included in the scope of this disclosure. For example, the arrangement may be a 10×10 arrangement, or a greater number of column and rows. The arrangement of pad electrodes 20 is not limited to a rectangular arrangement. In some embodiments, other arrangements include staggered rows and columns, where each pad electrode 20 is immediately adjacent to six other pad electrodes 20. In other embodiments, the pad electrodes 20 are arranged in a concentric circular arrangement. In other embodiments, the pad electrodes 20 are arranged around the periphery of the substrate or in a central portion of the substrate. In other embodiments, the pad electrodes 20 are irregularly spaced. In some embodiments, up to about 10,000 pad electrodes 20 are formed on the substrate. As set forth below, bump structures are formed over the pad electrodes 20. Accordingly, the bump structures have the same arrangement as the pad electrodes 20 in some embodiments.

In some embodiments, the substrate 10 is formed of at least one selected from the group consisting of silicon, diamond, germanium, SiGe, SiGeSn, SiGeC, GeSn, SiSn, GaAs, InGaAs, InAs, InP, InSb, GaAsP, GaInP, and SiC. In some embodiments, the semiconductor substrate 10 is a silicon wafer or substrate.

In some embodiments, one or more passivation layer 25 are formed as shown in FIGS. 1A and 1B. The passivation layer 25 includes one or more layers of silicon oxide, silicon nitride, SiON, SiC, SiOCN, SiCN or any other suitable insulating layers. The passivation layer 25 is patterned using suitable photolithography and etching operations to form openings, in which the pad electrodes are embedded, as shown in FIGS. 1A and 1B. In some embodiments, the opening has a tapered shape.

Figure 2B:
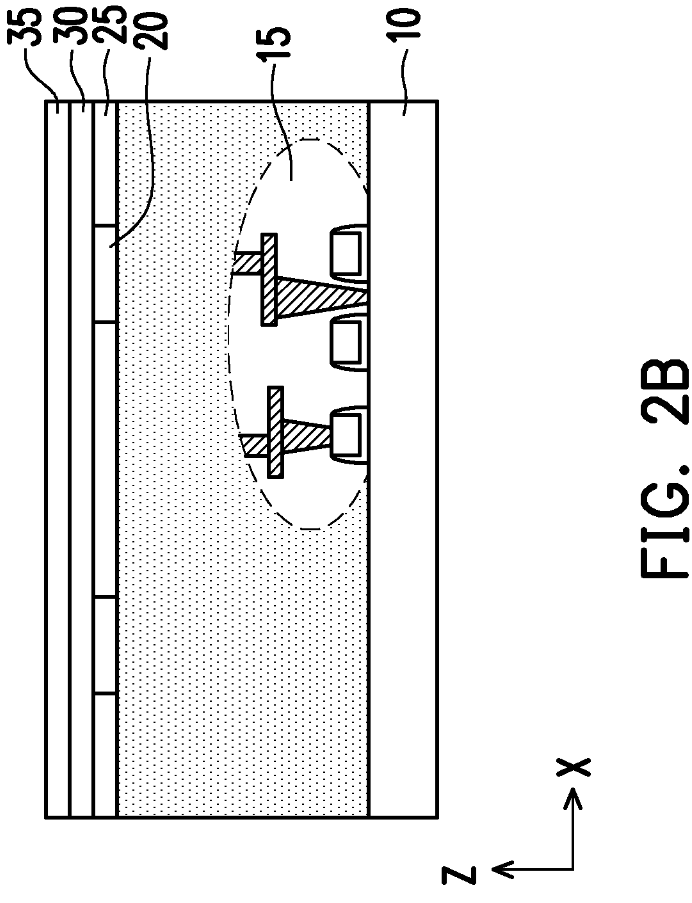
FIGS. 2A and 2B show one of the stages of a sequential manufacturing operation of a semiconductor device according to an embodiment of the present disclosure.
Figure 2A:
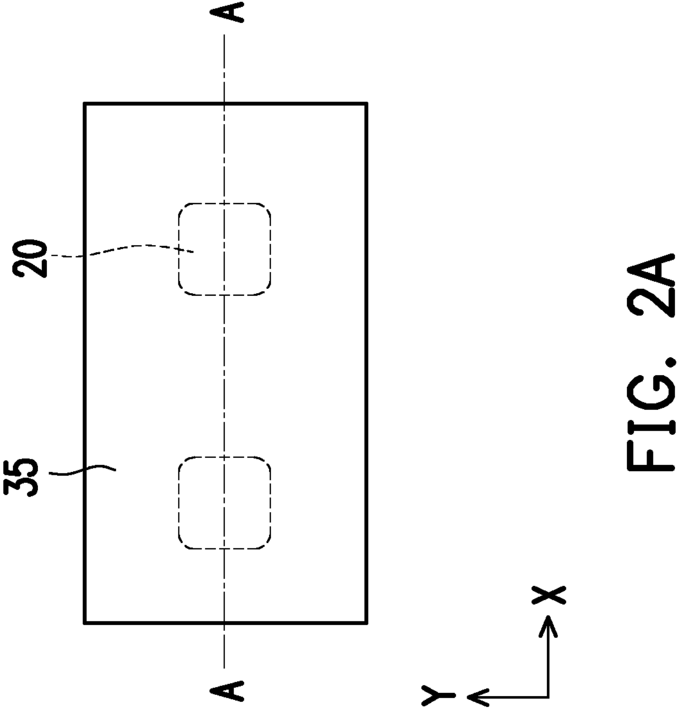

Then, as shown in FIGS. 2A and 2B, one or more conductive layers, as under bump metallization (UBM) layers, are formed over the passivation layer 25 and the pad electrodes 20. In some embodiments, the UBM layers include an underlying conductive layer (a first conductive layer) 30 and a seed layer (a second conductive layer) 35 formed on the underlying conductive layer 30. In some embodiments, the underlying conductive layer 30 includes Ti, TiN or TiW, and the seed layer 35 includes copper or a copper alloy. A copper alloy contains 50 mol % or greater copper in some embodiments. In some embodiments, the first and second conductive layers are formed by a suitable metal deposition operation, including physical vapor deposition (PVD) including sputtering, chemical vapor deposition (CVD), atomic layer deposition (ALD), thermal evaporation, and electron beam evaporation. In some embodiments, the underlying conductive layer 30 has a thickness ranging from about 0.01 μm to about 1.0 μm or about 0.1 μm to about 0.5 μm, and the seed layer 35 has a thickness ranging from about 0.01 μm to about 1.0 μm or about 0.1 μm to about 0.5 μm. In some embodiments, the total thickness of the first and second conductive layers 30, 35 is in a range from about 0.1 μm to about 0.5 μm.

Figure 3B:
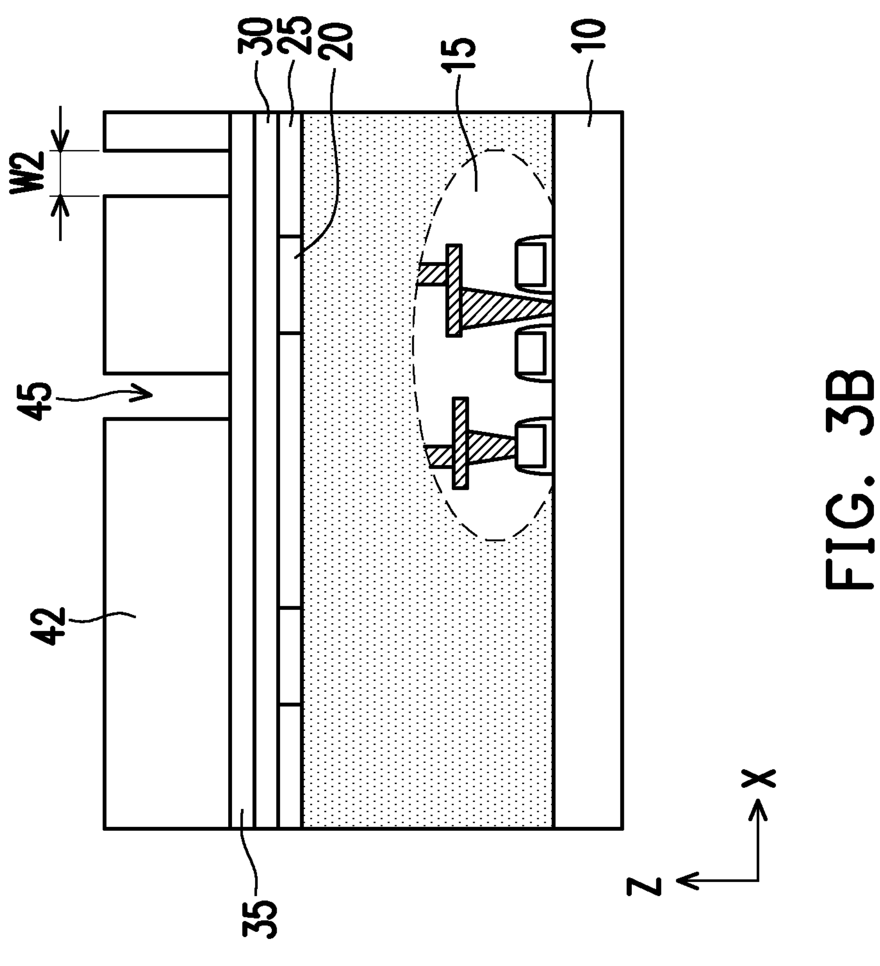
FIGS. 3A and 3B show one of the stages of a sequential manufacturing operation of a semiconductor device according to an embodiment of the present disclosure.
Figure 3A:
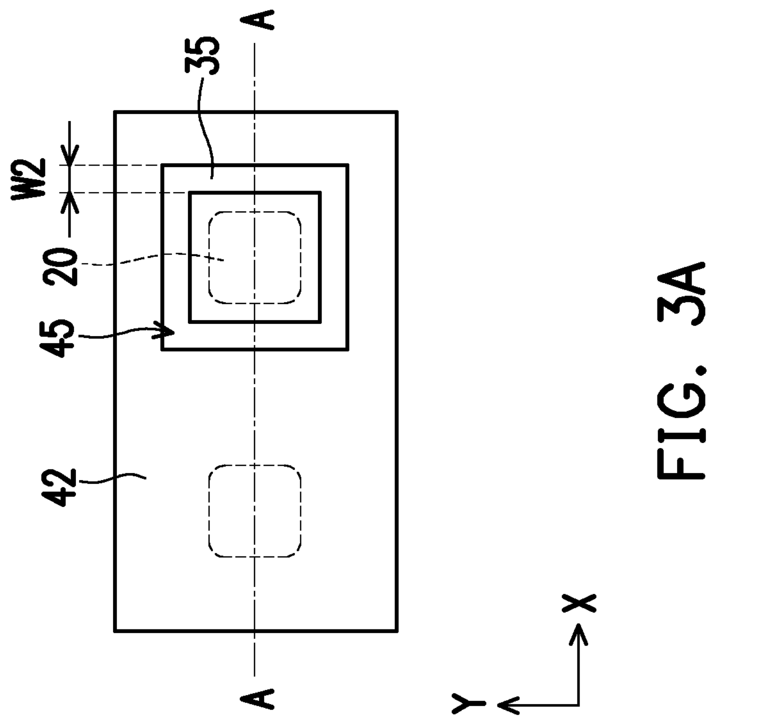

Next, a photoresist layer 42 is formed over the first and second conductive layers 30, 35, as shown in FIGS. 3A and 3B. The photoresist layer 42 can be a positive photoresist or a negative photoresist. When the photoresist is a positive resist, the portion of the photoresist exposed to the actinic radiation becomes soluble in the developer and is removed during the development operation. When the photoresist is a negative photoresist, the portion of the photoresist exposed to actinic radiation becomes insoluble in the developer and remains on the device, while the portion not exposed to the actinic radiation is removed, during the development operation. In some embodiments, the actinic radiation is ultraviolet radiation including i-line and g-line radiation, and deep ultraviolet radiation. In some embodiments, the actinic radiation is generated by a mercury arc lamp, or a laser, including ArF and KrF excimer lasers.

The photoresist layer 42 is subsequently selectively exposed to actinic radiation, and developed to form a plurality of first openings 45 exposing the second conductive layer 35, as shown in FIGS. 3A and 3B. In some embodiments, the first opening 45 has a ring or a frame shape as shown in FIG. 3A. In some embodiments, the first opening 45 surrounds the pad electrode 20 in plan view. In other embodiments, the first opening 45 overlaps the periphery of the pad electrode 20. In certain embodiments, the periphery of the pad electrode is located outside the first opening 45. In some embodiments, the width W2 of the first opening 45 is in a range from about 0.1 μm to about 1 μm.

Figure 4B:
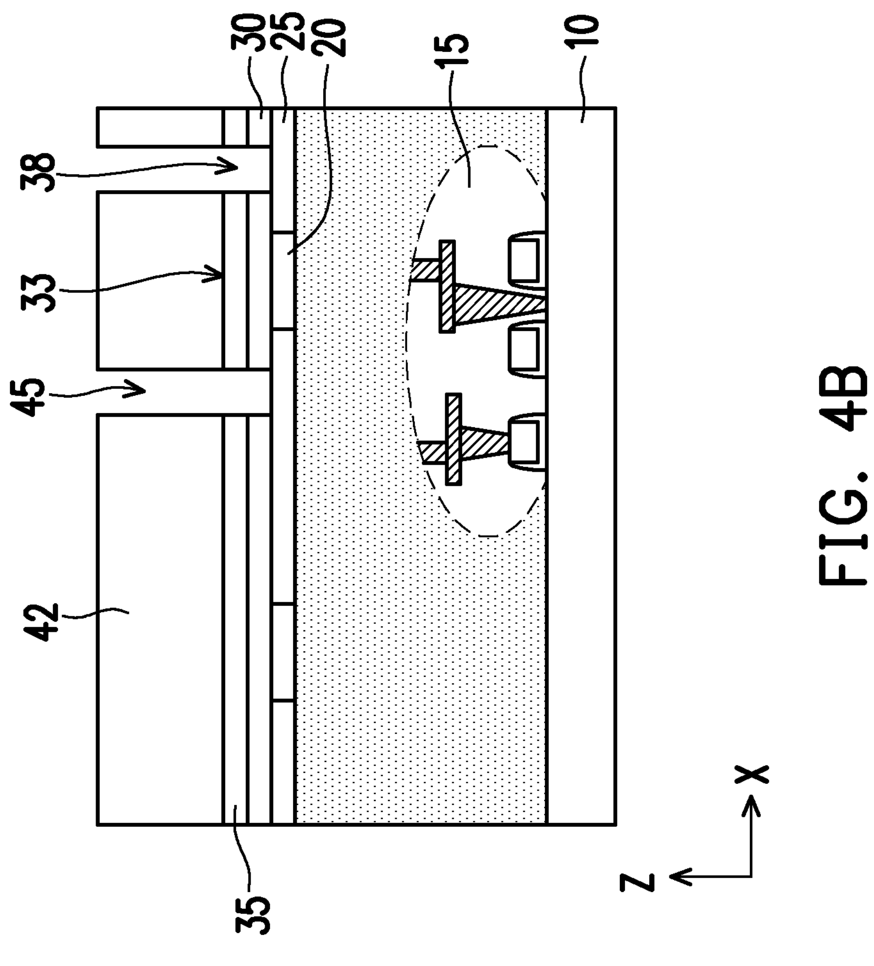
FIGS. 4A and 4B show one of the stages of a sequential manufacturing operation of a semiconductor device according to an embodiment of the present disclosure.
Figure 4A:
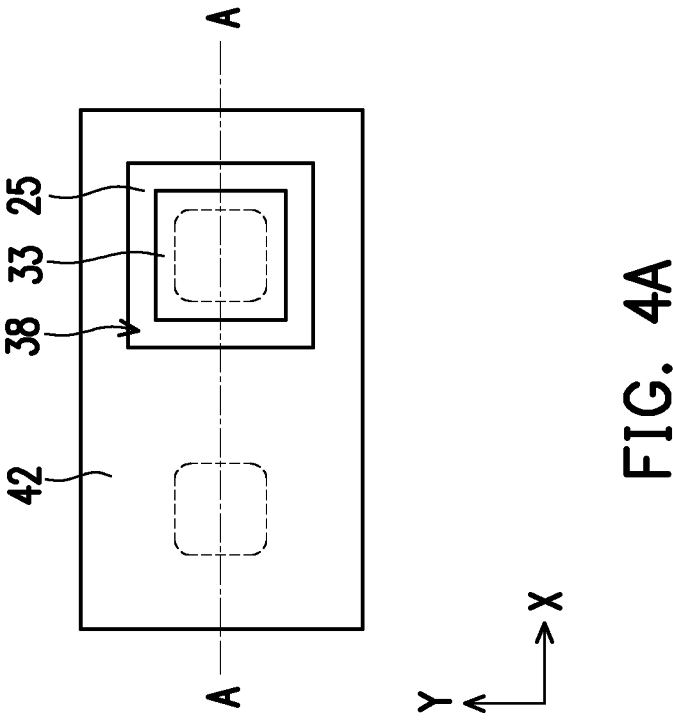
Figure 5B:
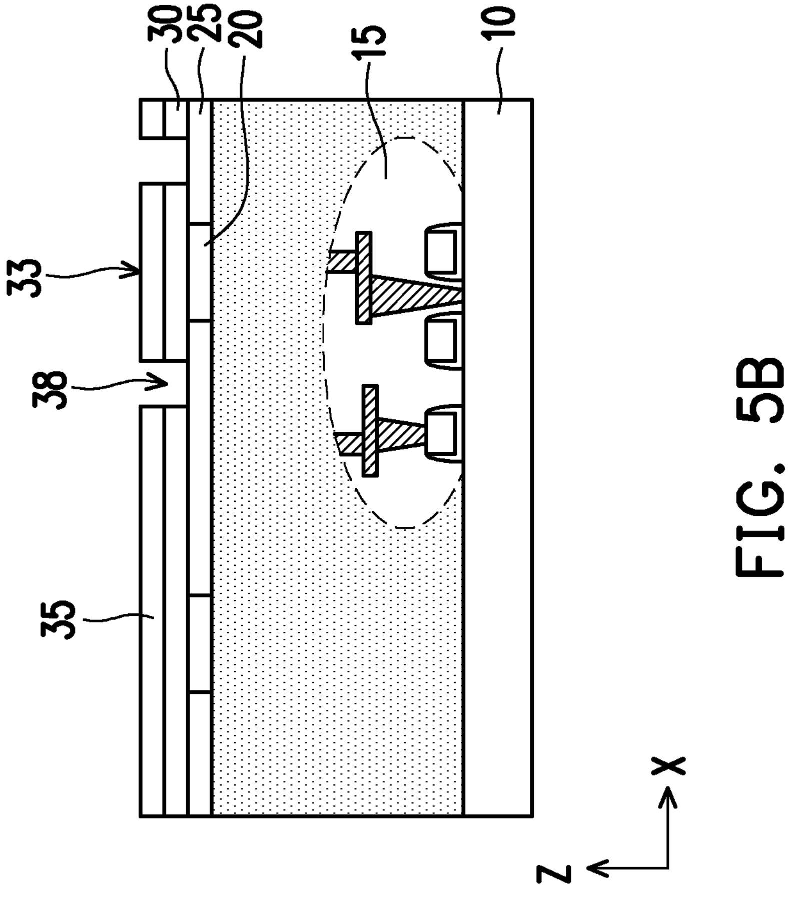
FIGS. 5A and 5B show one of the stages of a sequential manufacturing operation of a semiconductor device according to an embodiment of the present disclosure.
Figure 5A:
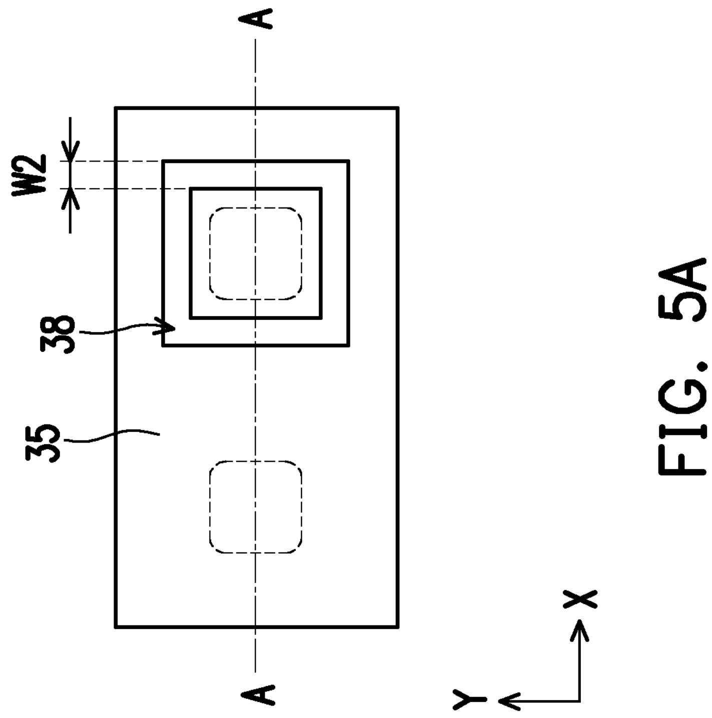

Then, as shown in FIGS. 4A and 4B, the first and second conductive layers 30 and 35 are patterned by using the photoresist layer 42 as an etching mask. The etching includes one or more of dry etching and wet etching. As shown in FIGS. 4A and 4B, a groove 38 is formed to surround an island pattern 33 of the first and second conductive layers 30 and 35, under which the pad electrode 20 is disposed. Thus, the island pattern 33 of the UBM layers 30 and 35 is electrically isolated from the remaining part of the first and second conductive layers by the groove 38. In some embodiments, the width of the groove 38 is in a range from about 0.1 μm to about 1 μm. In some embodiments, the width of the island pattern 33 is in a range from about 10 μm to about 500 μm, and is in a range from about 20 μm to about 100 μm in other embodiments. In some embodiments, the width of the island pattern 33 is the same as, smaller than or larger than the width W1 of the pad electrode 20. In some embodiments, the groove 38 has a circular shape having a diameter in a range from about 10 μm to about 500 μm or in a range from about 20 μm to about 100 μm. The photoresist layer 42 is removed by using a suitable photoresist stripper solution or by an oxygen plasma ashing operation, as shown in FIGS. 5A and 5B.

Figure 6B:
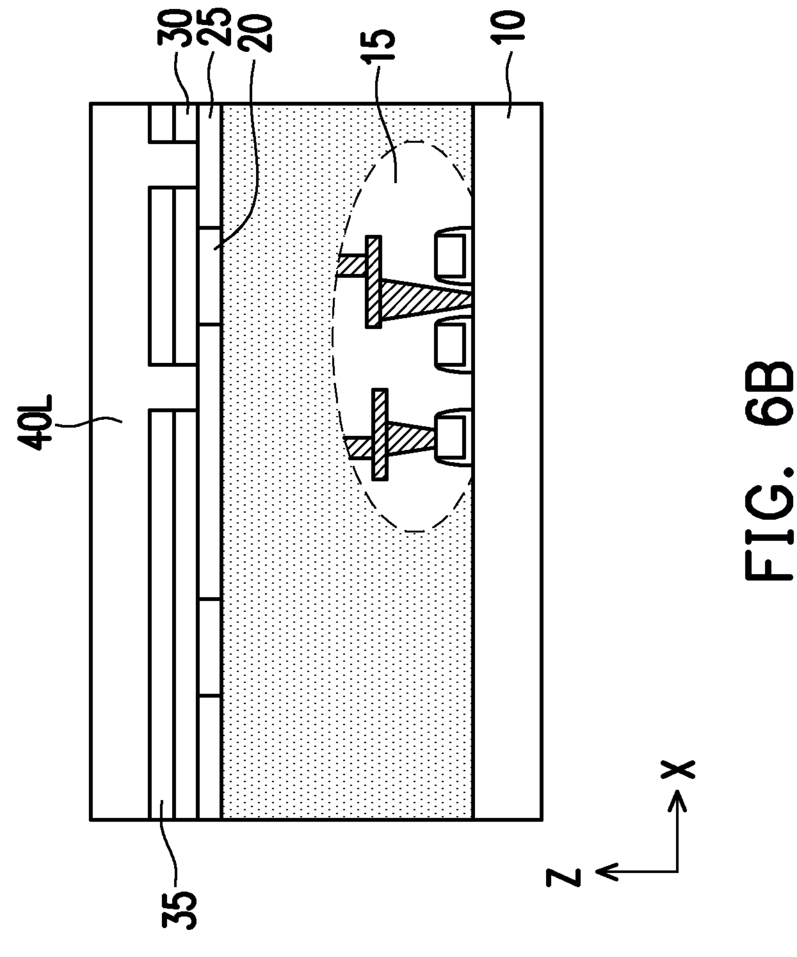
FIGS. 6A and 6B show one of the stages of a sequential manufacturing operation of a semiconductor device according to an embodiment of the present disclosure.
Figure 6A:
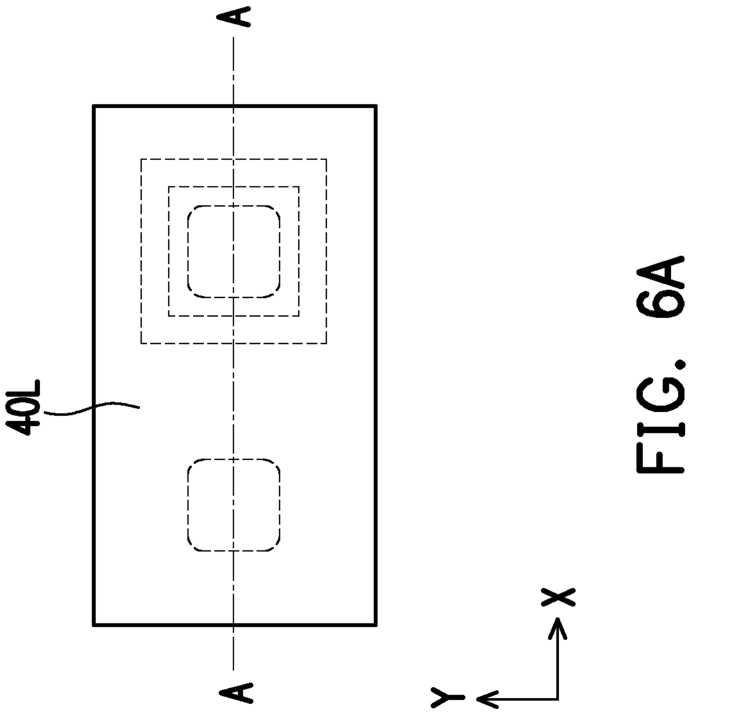

Then, as shown in FIGS. 6A and 6B, an insulating layer 40L is formed to over the second conductive layer 35 and in the groove 38. The insulating layer 40L is formed by a suitable film deposition operation, including physical vapor deposition (PVD), chemical vapor deposition (CVD), and atomic layer deposition (ALD). In some embodiments, the insulating layer 40L is made of silicon oxide, silicon nitride, SiON, SiOC, SiOCN, SiCN, or an organic material, such as a polymer or a resin (e.g., polyimide). In some embodiments, the insulating layer 40L includes a low-k dielectric material (SiOC, SiOCN, SiCN, etc).

Figure 7B:
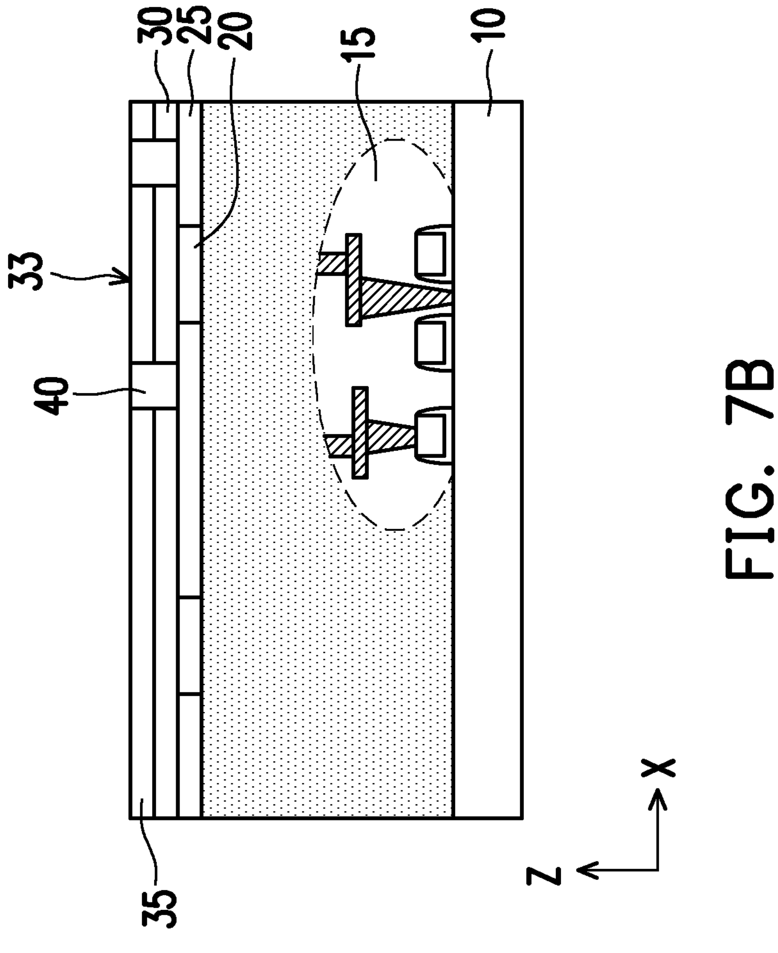
FIGS. 7A and 7B show one of the stages of a sequential manufacturing operation of a semiconductor device according to an embodiment of the present disclosure.
Figure 7A:
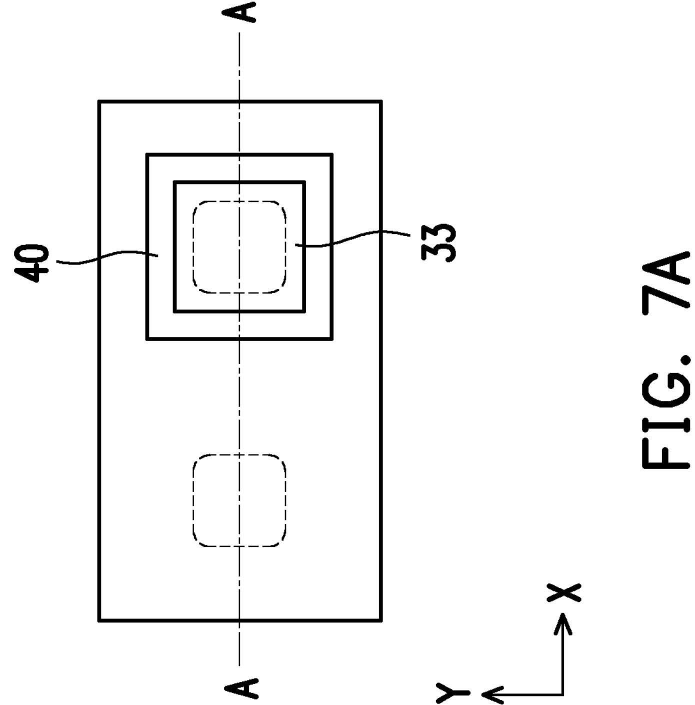

The insulating layer 40L is subjected to a planarization operation, such as CMP, to form isolation structure 40 as shown in FIGS. 7A and 7B.

Figure 8B:
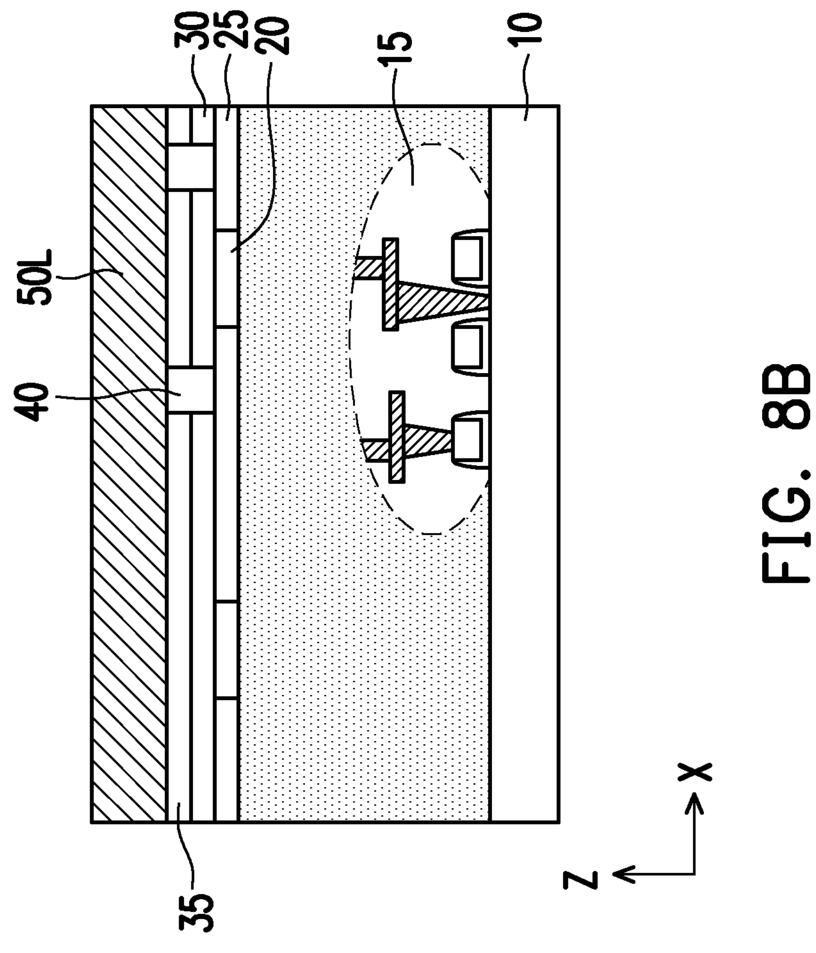
FIGS. 8A and 8B show one of the stages of a sequential manufacturing operation of a semiconductor device according to an embodiment of the present disclosure.
Figure 8A:
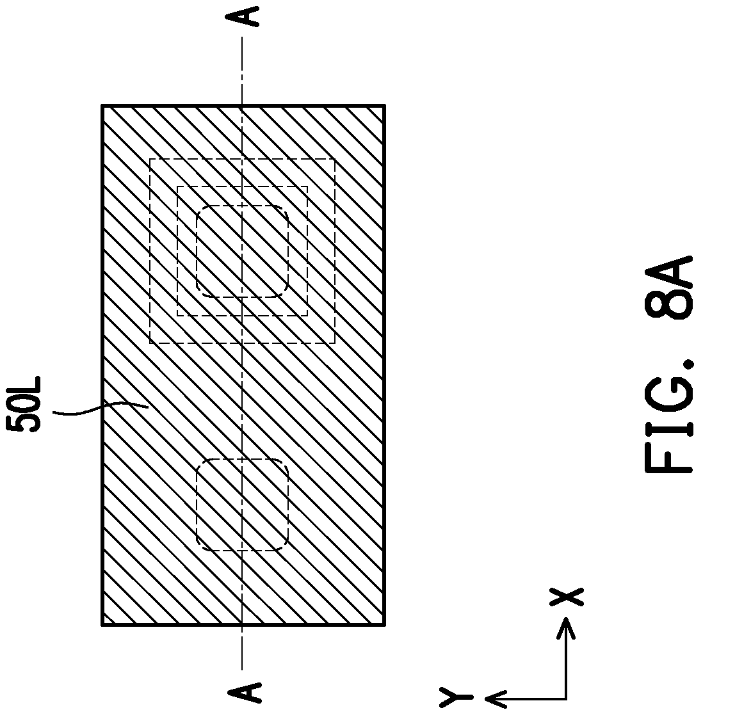

Next, as shown in FIGS. 8A and 8B, one or more first main conductive layers 50L are formed over the second conductive layer 35 and the isolation structure 40. In some embodiments, the first main conductive layer 50L is formed by a suitable metal deposition operation, including physical vapor deposition (PVD) including sputtering, chemical vapor deposition (CVD), atomic layer deposition (ALD), thermal evaporation, and electron beam evaporation. In some embodiments, the first main conductive layer 50L includes Cu, Al, Au, Ti or an alloy or compound thereof (e.g., AlCu).

Figure 9B:
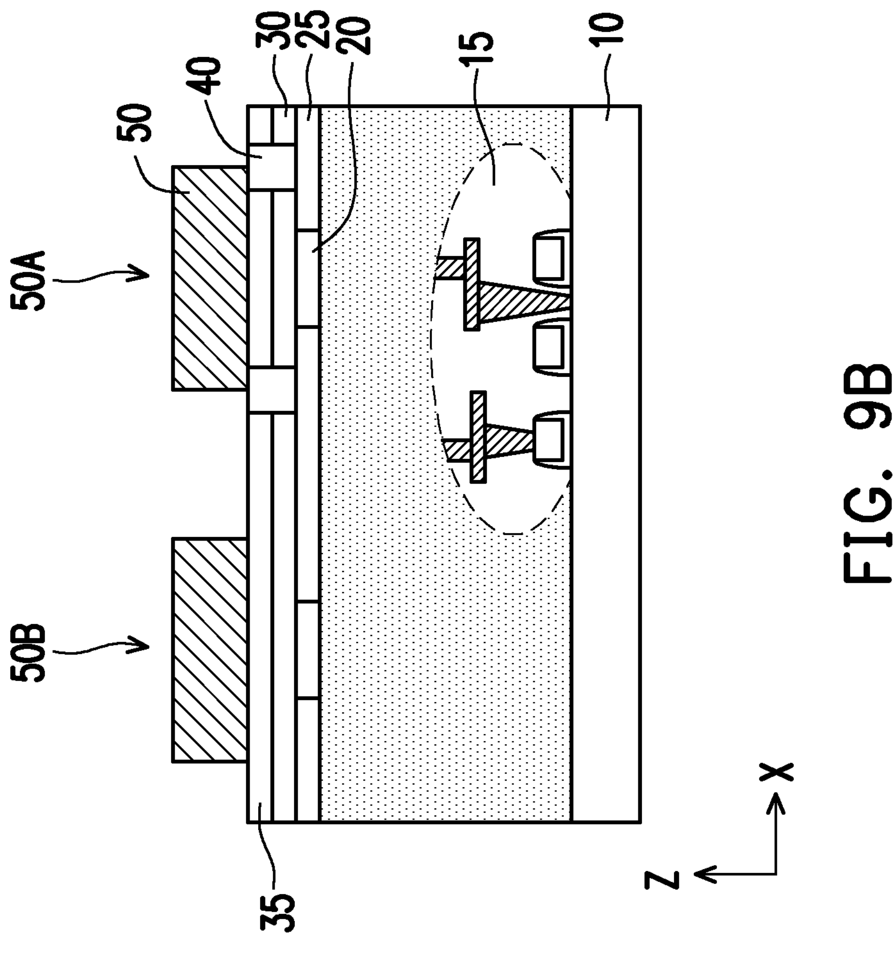
FIGS. 9A and 9B show one of the stages of a sequential manufacturing operation of a semiconductor device according to an embodiment of the present disclosure.
Figure 9A:
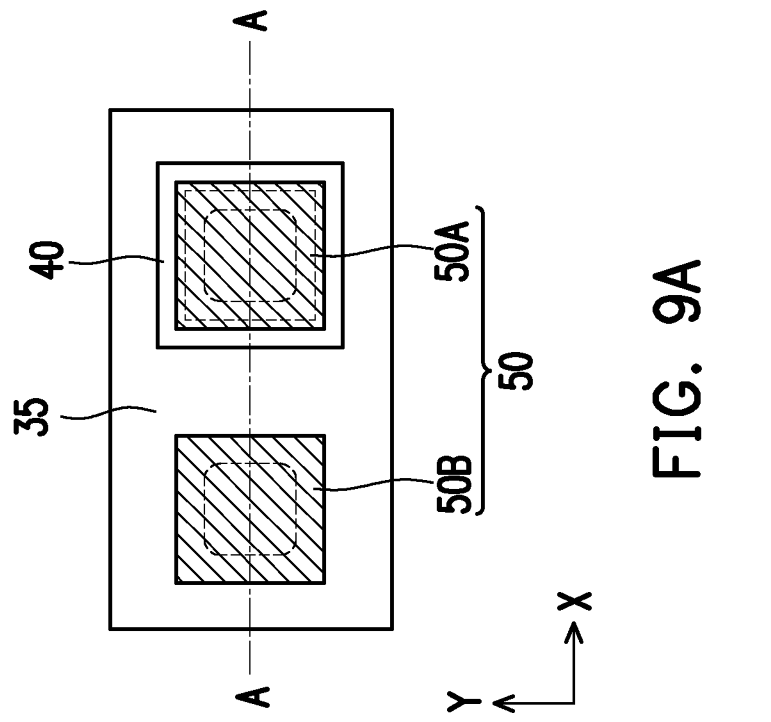

Then, by using one or more lithography and etching operations, the first main conductive layer 50L is patterned into bump electrodes (metal pads or metal pad electrodes) 50, as shown in FIGS. 9A and 9B. In some embodiments, a first bump electrode 50A is formed over the isolation structure 40 such that the periphery of the first bump electrode 50A is located over the isolation structure 40. Thus, a part of the isolation structure 40 is exposed from the first bump electrode 50A in a ring or a frame shape as shown in FIGS. 9A and 9B. The isolation structure functions as an etching stop layer in some embodiments. In some embodiments, the bump electrodes include a second bump electrode 50B, of which bottom surface is entirely in contact with the second conductive layer 35, where no isolation structure is disposed.

In some embodiments, the following operations are optionally performed to adjust (increase) the thickness of the bump electrodes.

Figure 10B:
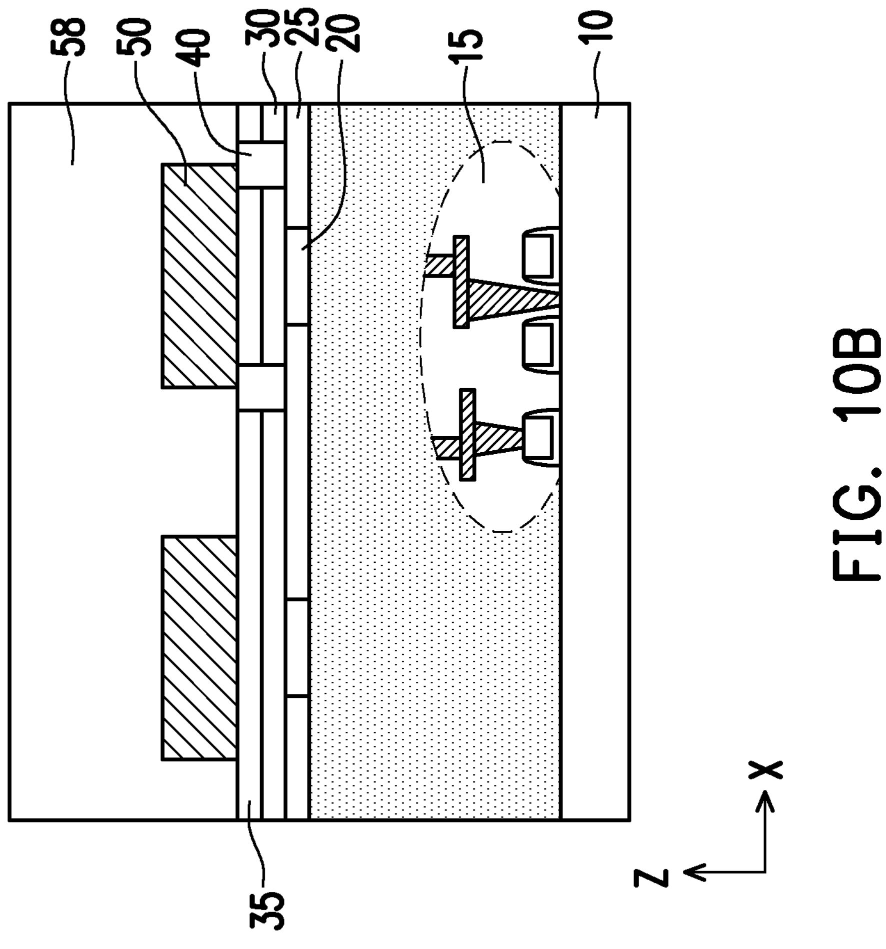
FIGS. 10A and 10B show one of the stages of a sequential manufacturing operation of a semiconductor device according to an embodiment of the present disclosure.
Figure 10A:
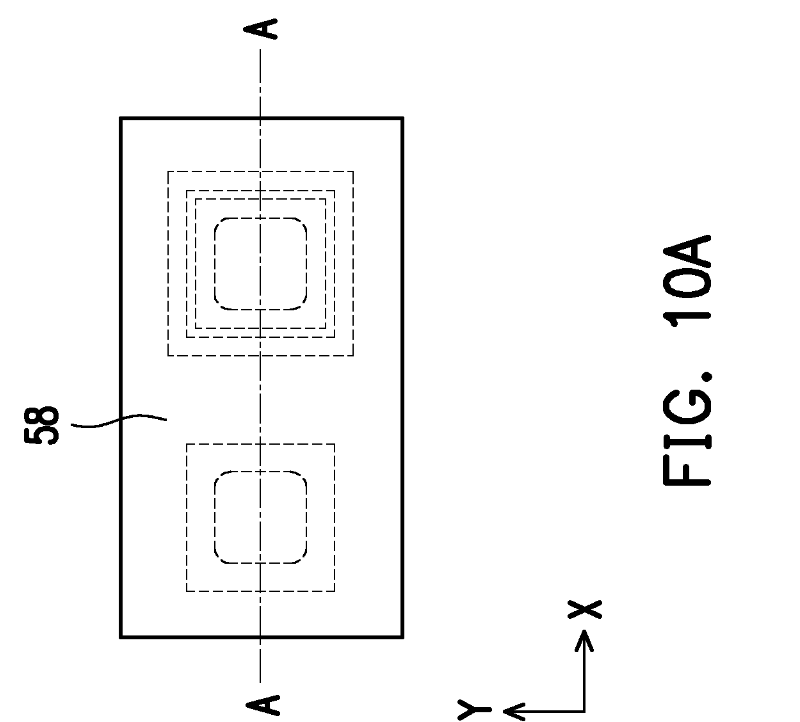
Figure 11B:
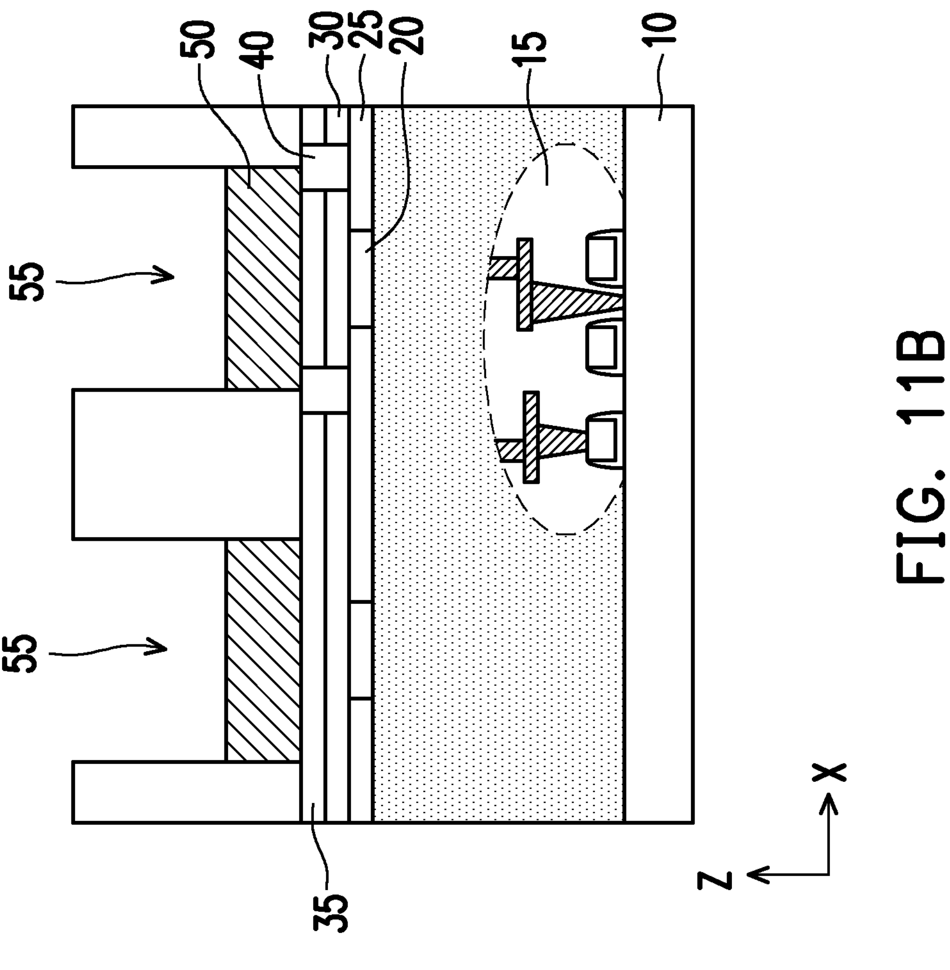
FIGS. 11A and 11B show one of the stages of a sequential manufacturing operation of a semiconductor device according to an embodiment of the present disclosure.
Figure 11A:
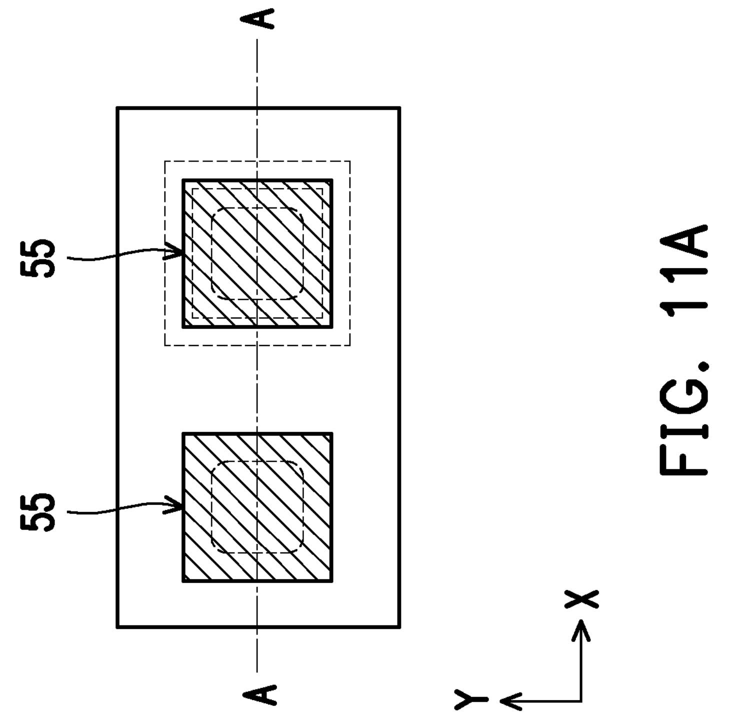

As shown in FIGS. 10A and 10B, a second photoresist layer 58 is formed over the bump electrode 50, and then as shown in FIGS. 11A and 11B, second openings 55 are formed using a lithography operation over the bump electrodes 50.

Figure 12B:
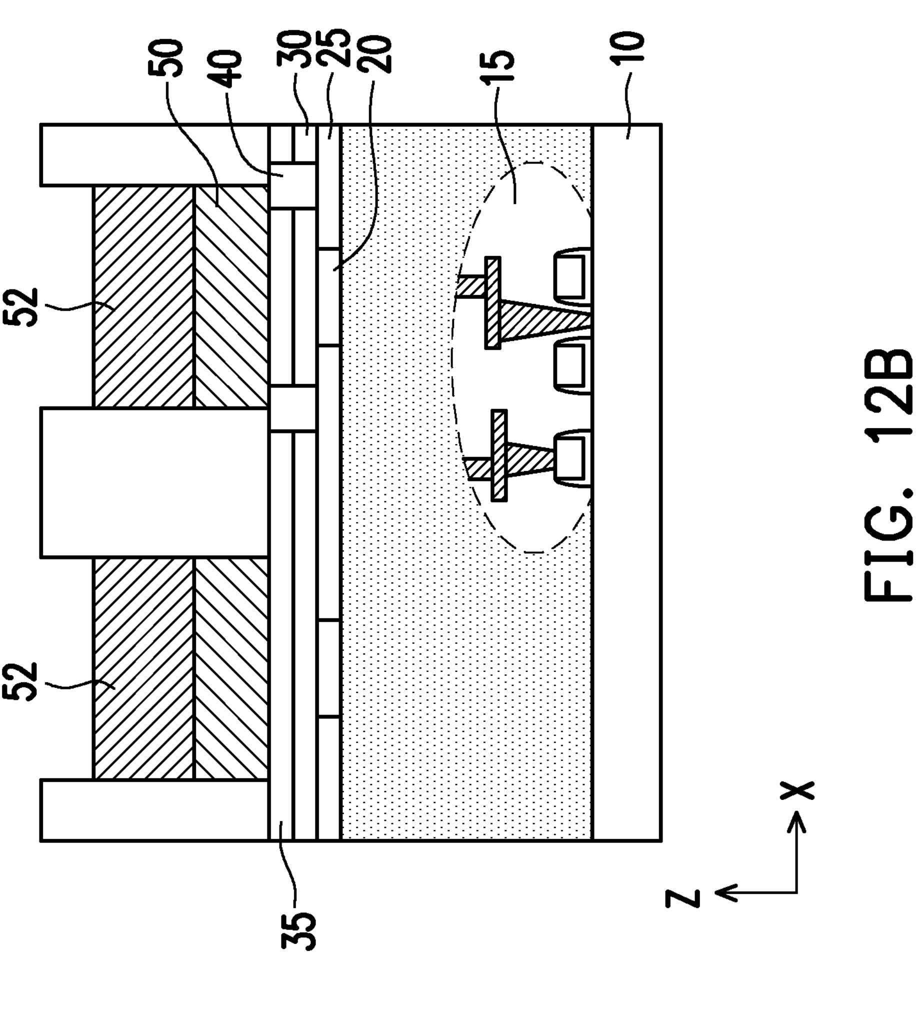
FIGS. 12A and 12B show one of the stages of a sequential manufacturing operation of a semiconductor device according to an embodiment of the present disclosure.
Figure 12A:
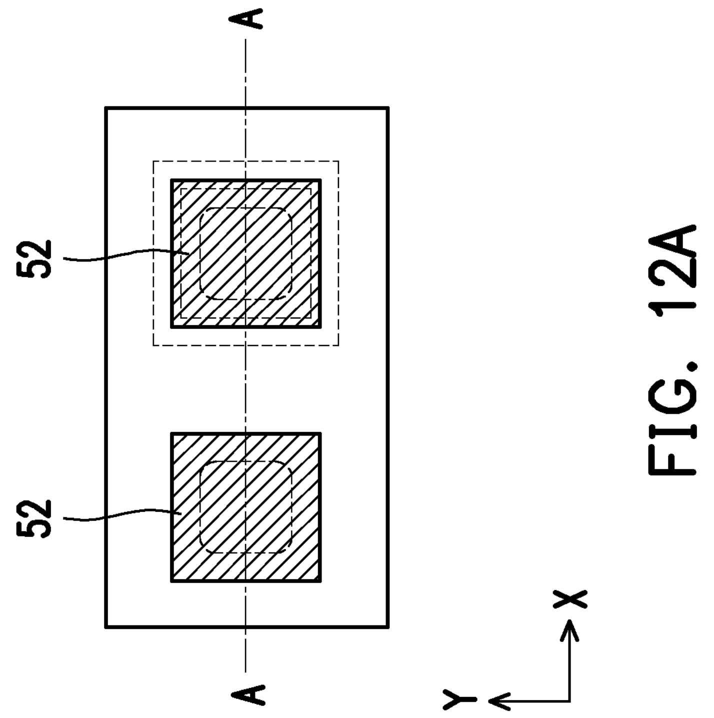
Figures 13A, 13B:
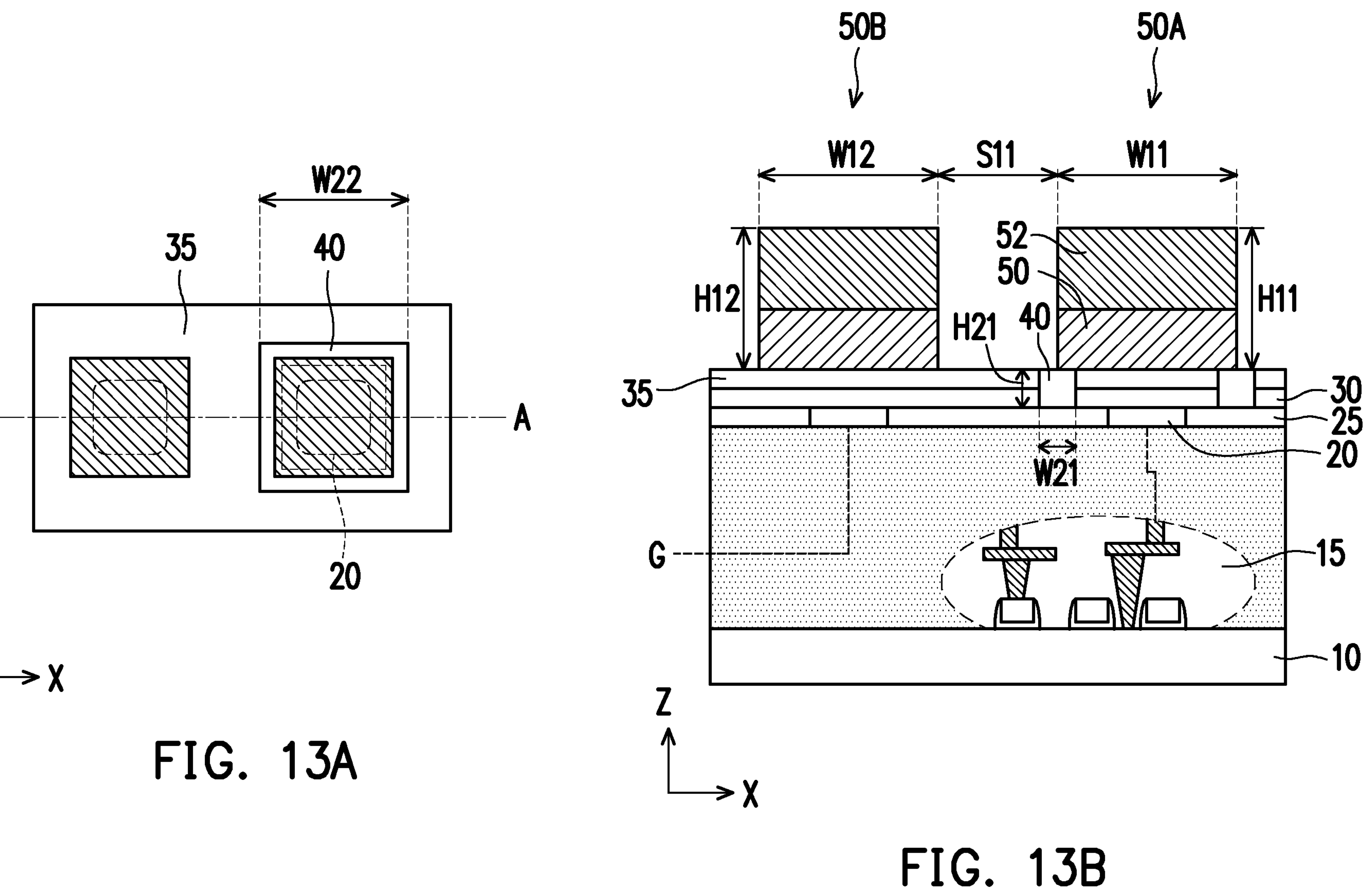
FIGS. 13A and 13B show one of the stages of a sequential manufacturing operation of a semiconductor device according to an embodiment of the present disclosure.

The second openings 55 are subsequently filled with one or more conductive materials 52 to increase the thickness or height of the bump electrodes, as shown in FIGS. 12A and 12B. The second opening 55 has a width in a range from about 10 μm to about 500 μm in some embodiments, and in a range from about 20 μm to about 100 μm in other embodiments. Subsequently, the photo resist layer 58 is removed as shown in FIGS. 13A and 13B.

In some embodiments, the conductive material 52 includes at least one selected from the group consisting of aluminum, chromium, iron, manganese, magnesium, molybdenum, nickel, niobium, tantalum, titanium, tungsten, zinc, and alloys thereof. In some embodiments, the conductive material 52 includes a eutectic solder, such as an alloy selected from the group consisting of AgSn, SnAgCu, PbSn, and CuSn in some embodiments. In some embodiments, the conductive material 52 is formed by electro plating. In other embodiments, the conductive material 52 is formed by CVD or PVD using a resist lift-off technology.

In some embodiments, the thickness H11 and H12 of the bump electrodes 50A and 50B, respectively, is in a range from about 10 μm to about 80 μm, depending on the design and/or process requirements. In some embodiments, the width W11 and W12 of the bump electrodes 50A and 50B is in a range from about 1 μm to about 5 μm. In some embodiments, the space S11 between the bump electrodes 50A and 50B is in a range from about 1 μm to about 5 μm. In some embodiments the width W21 of the insulation structure 40 is in a range from about 0.1 μm to about 1 μm. In some embodiments, the value (W12+S11)/W21 is equal to or more than about 5 and is less than about 20. In some embodiments, the height H21 of the isolation structure 40 is equal to (100%), smaller than (>95%) or greater than (<105%) of the total thickness of the UBM layers 30 and 35. In some embodiments, the height H21 is in a range from about 0.1 μm to about 0.5 μm. In some embodiments, the outer width W22 of the isolation structure 40 is greater than the width W11 of the bump electrode 50A.

In some embodiments, the area of the second conductive layer 35 in contact with the bottom of the bump electrode 50A is smaller than the area of the second conductive layer 35 in contact with the bottom of the bump electrode 50B. In some embodiments, the area of the second conductive layer 35 electrically contacting the bump electrode 50A is smaller than the area of the second conductive layer 35 electrically contacting the bump electrode 50B.

In some embodiments, the bump electrode 50A is coupled to one or more of the transistors through a part of the one or more wiring layers. In some embodiments, the bump electrode 50B is coupled to a ground potential G or Vss of the electronic circuit through one or more wiring layers.

In some embodiments, as shown in FIG. 13C, a part of the isolation structure 40 is recessed or etched when etching the first main conductive layer 50L to form the bump electrodes 50. Thus, the isolation structure 40 has a first thickness under the bump electrode 50 and a second thickness outside the bump electrode 50 smaller than the first thickness.

In some embodiments, as shown in FIG. 13D, a part of the second conductive layer 35 of the UBM layer is recessed or etched when etching the first main conductive layer 50L to form the bump electrodes 50. Thus, the second conductive layer 35 has a first thickness under the bump electrode 50 and a second thickness outside the bump electrode 50 smaller than the first thickness. In some embodiments, the recessed structures shown in FIGS. 13C and 13D are both formed.

In some embodiments, when the upper surface of the isolation structure 40 is formed below the upper surface of the second conductive layer 35, the bump electrode 50 is formed to have a concave shape as shown in FIG. 13E. In some embodiments, when the upper surface of the isolation structure 40 is formed above the upper surface of the second conductive layer 35, the bump electrode 50 is formed to have a convex shape as shown in FIG. 13F. In some embodiments, one or more of the recessed structures shown in FIGS. 13C and 13D can be combined with one of the structures shown in FIG. 13E or 13F.

Figure 14B:
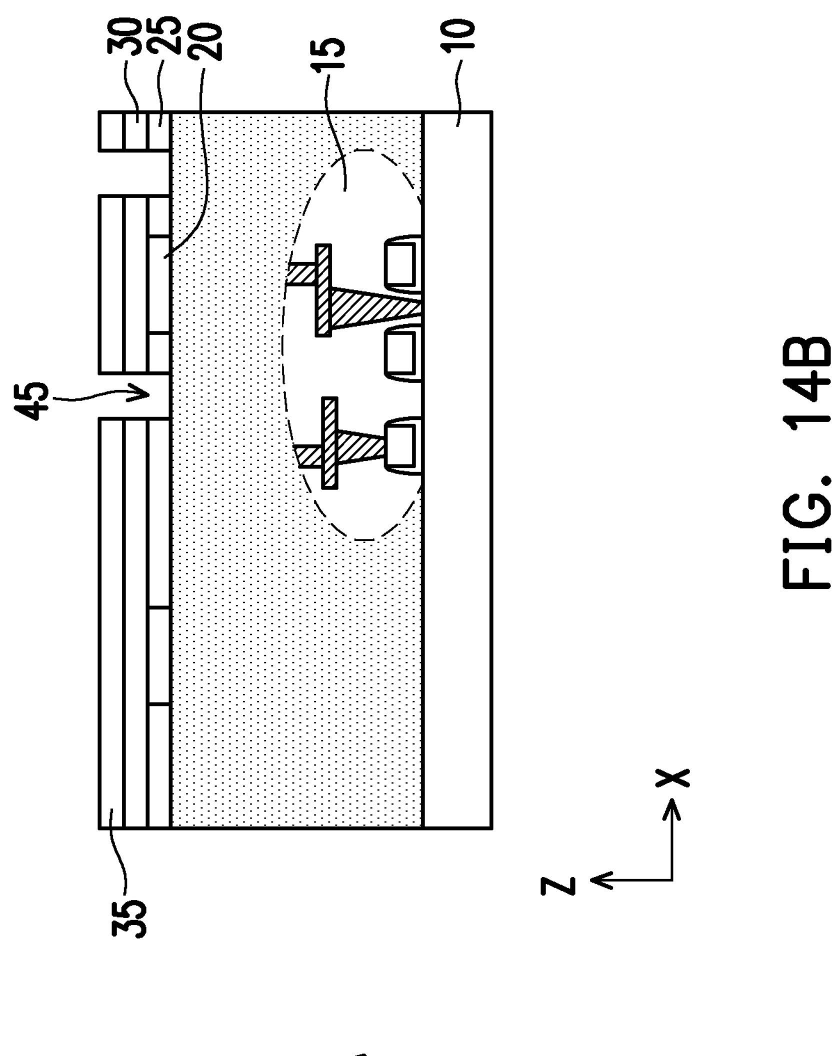
FIGS. 14A and 14B show one of the stages of a sequential manufacturing operation of a semiconductor device according to an embodiment of the present disclosure.
Figure 14A:
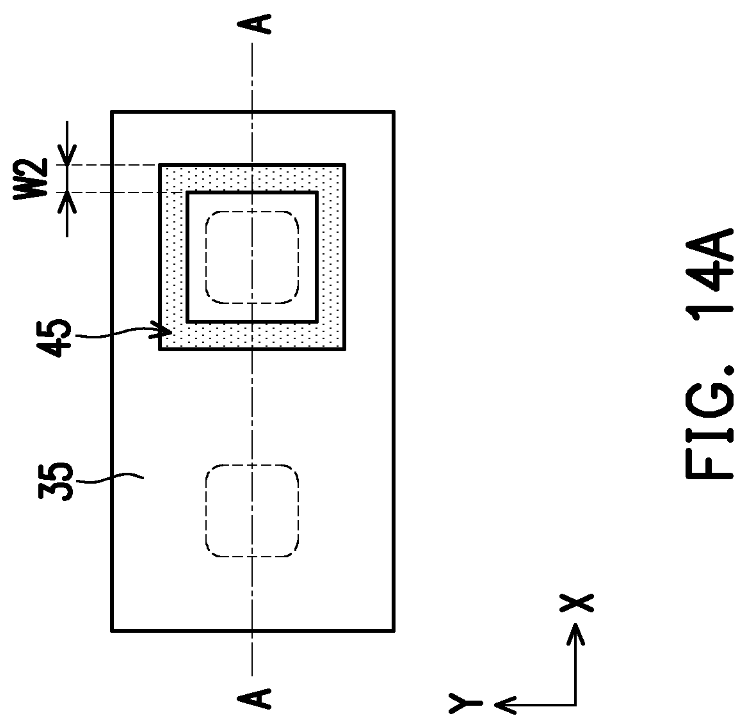
Figure 15B:
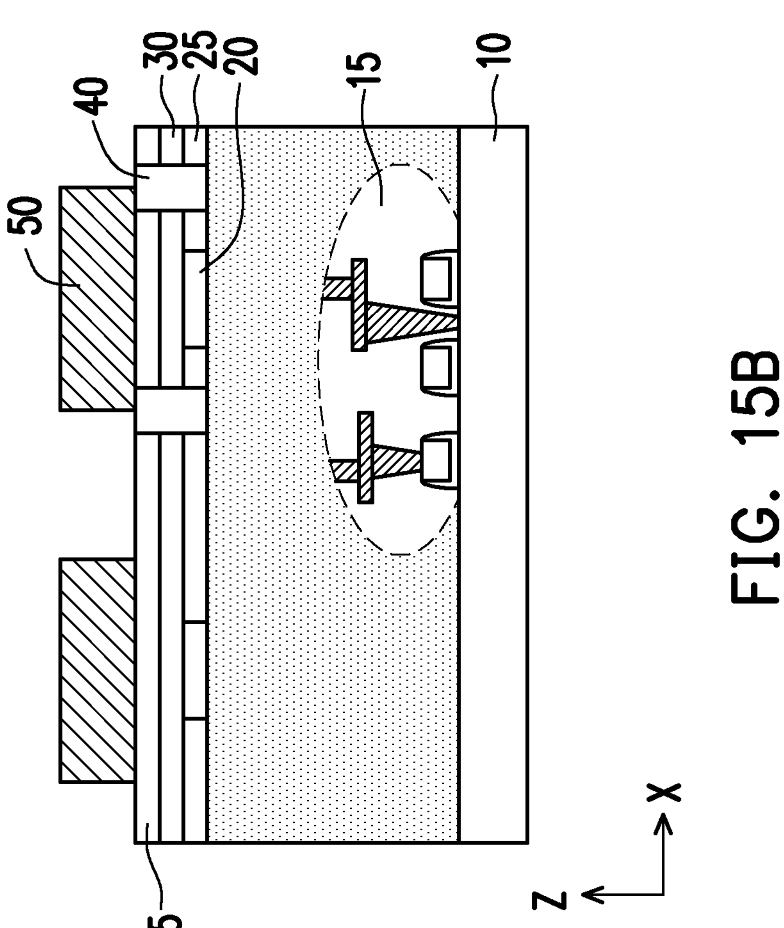
FIGS. 15A and 15B show one of the stages of a sequential manufacturing operation of a semiconductor device according to an embodiment of the present disclosure.
Figure 15A:
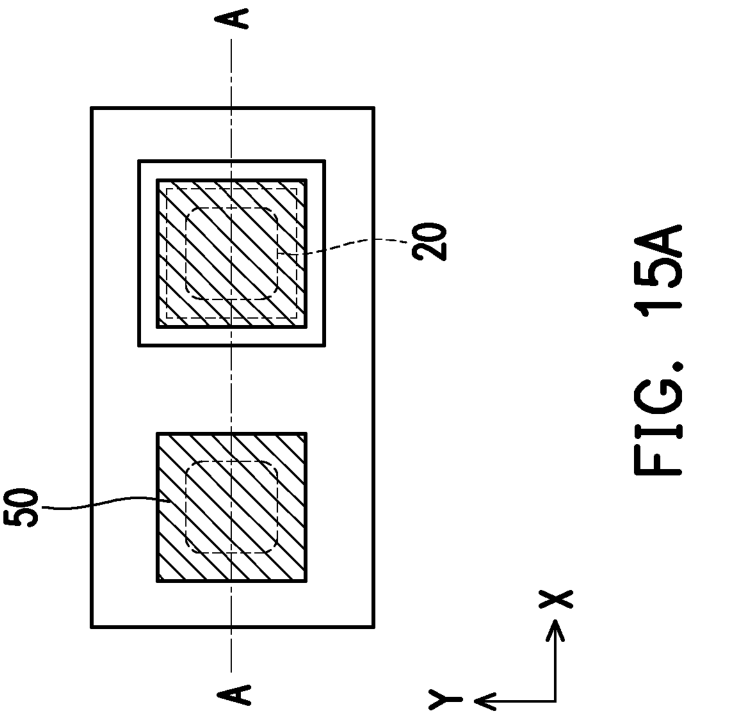

In some embodiments, as shown in FIGS. 14A and 14B, when the first opening 45 as shown in FIGS. 4A-5B, the passivation layer 25 is also partially or fully etched. Then, the isolation structure 40 is formed in the first opening 45 shown in FIGS. 14A and 14B, and the bump electrodes 50 are formed as shown in FIGS. 15A and 15B. In some embodiments, the isolation structure 40 is separated from the pad electrode 20 by the passivation layer 25.

Figure 16B:
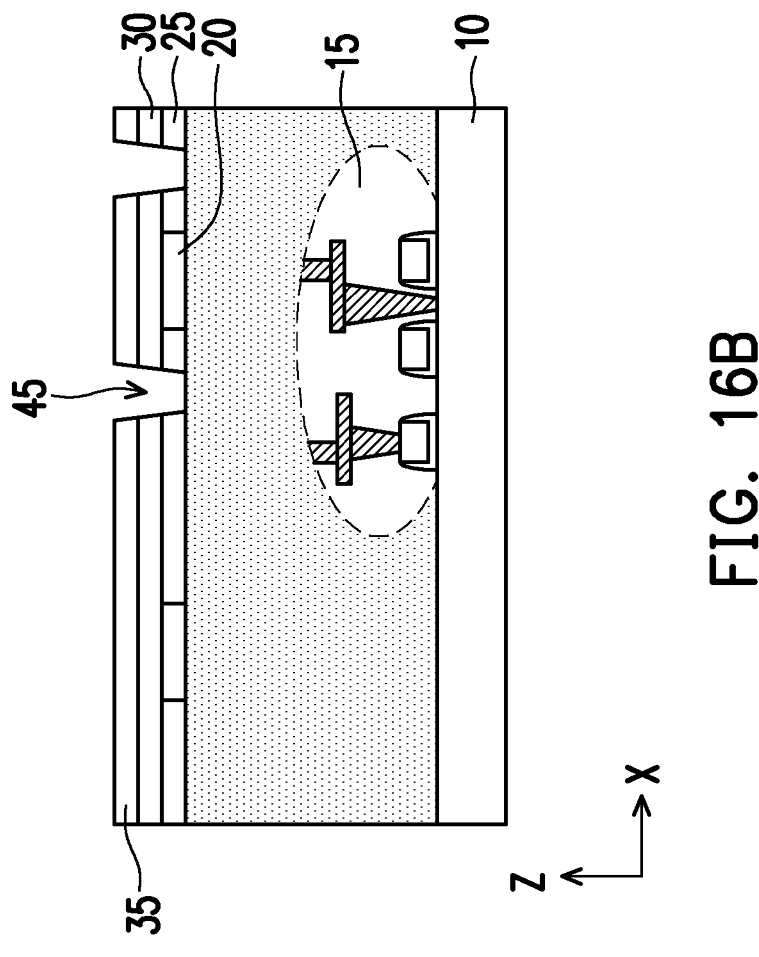
FIGS. 16A and 16B show one of the stages of a sequential manufacturing operation of a semiconductor device according to an embodiment of the present disclosure.
Figure 16A:
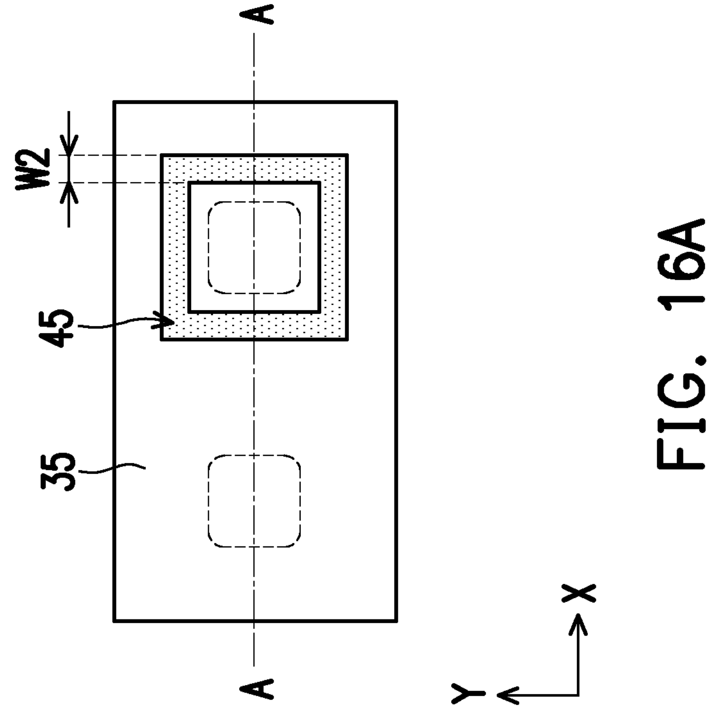
Figure 17B:
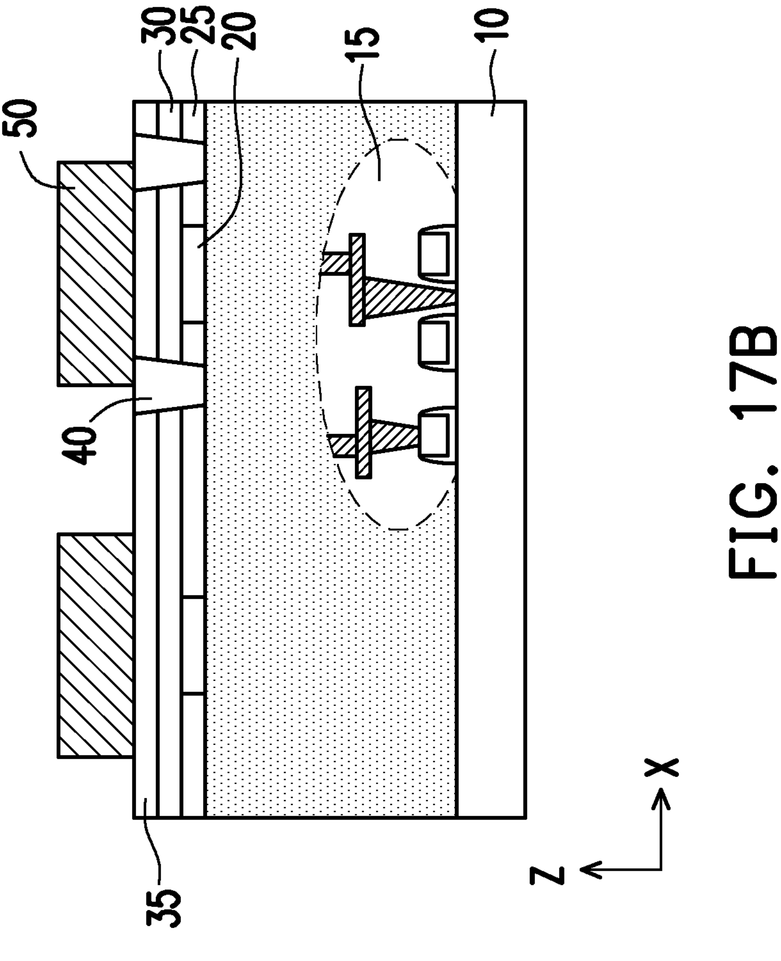
FIGS. 17A and 17B show one of the stages of a sequential manufacturing operation of a semiconductor device according to an embodiment of the present disclosure.
Figure 17A:
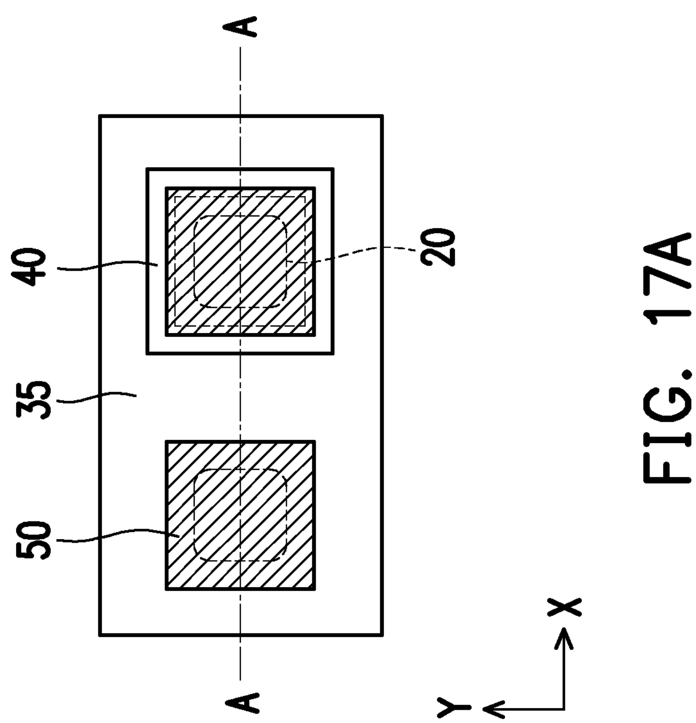

In some embodiments, as shown in FIGS. 16A and 16B, the first opening 45 is formed to have a tapered shape. Then, the isolation structure 40 is formed in the first opening 45 shown in FIGS. 16A and 16B, and the bump electrodes 50 are formed as shown in FIGS. 17A and 17B. In some embodiments, the isolation structure 40 has a top having a width 10% to 50% greater than a width of the bottom.

Figure 18B:
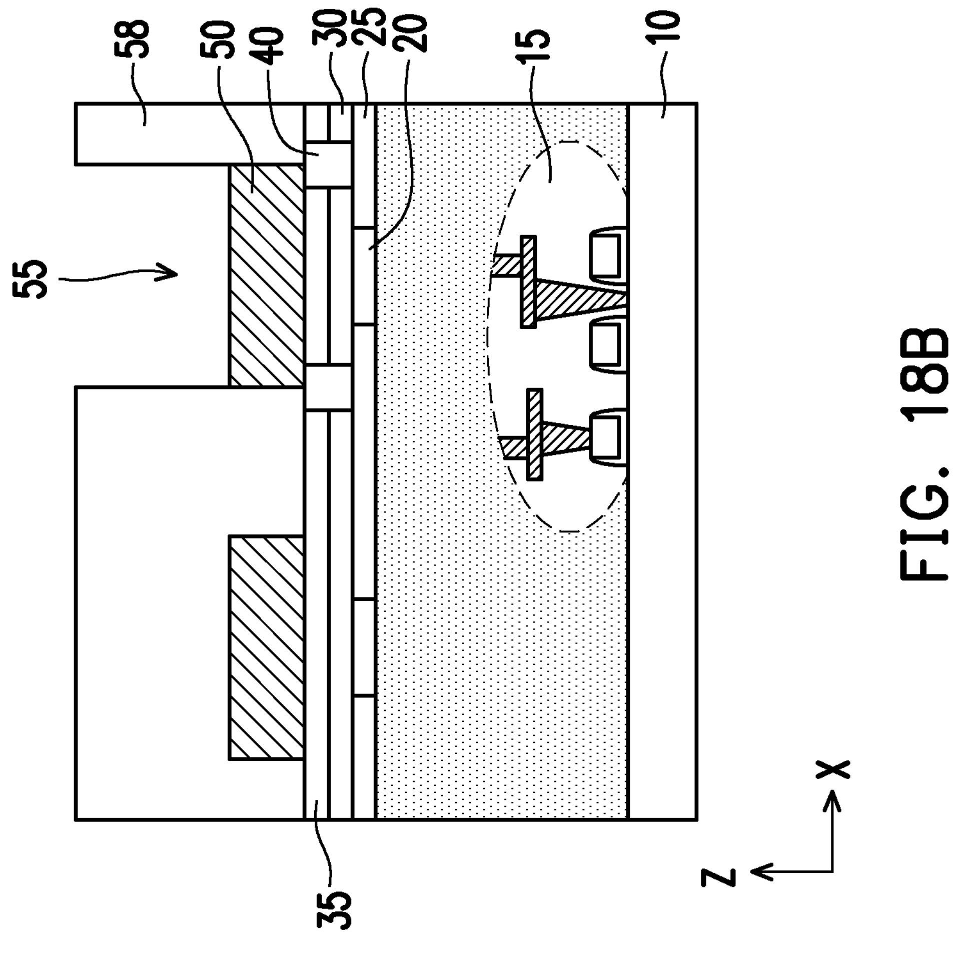
FIGS. 18A and 18B show one of the stages of a sequential manufacturing operation of a semiconductor device according to an embodiment of the present disclosure.
Figure 18A:
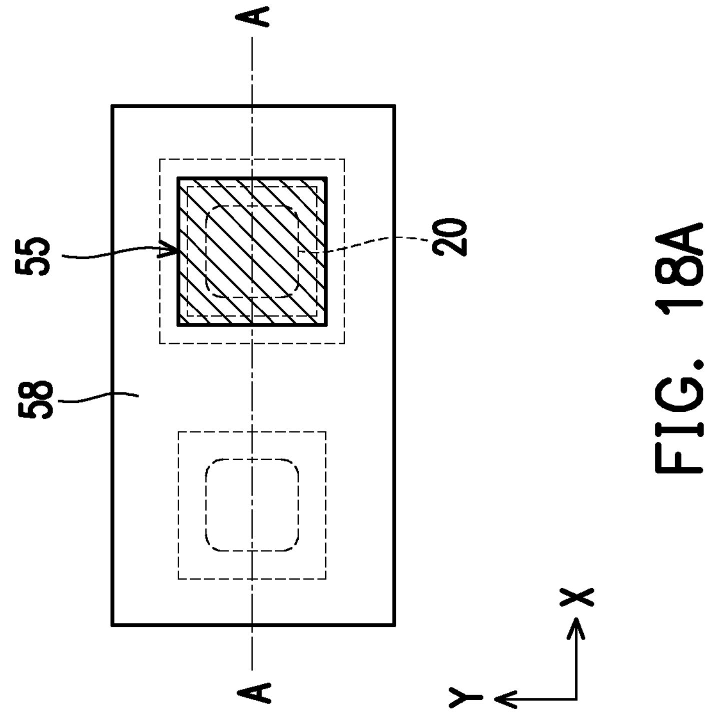
Figure 19B:
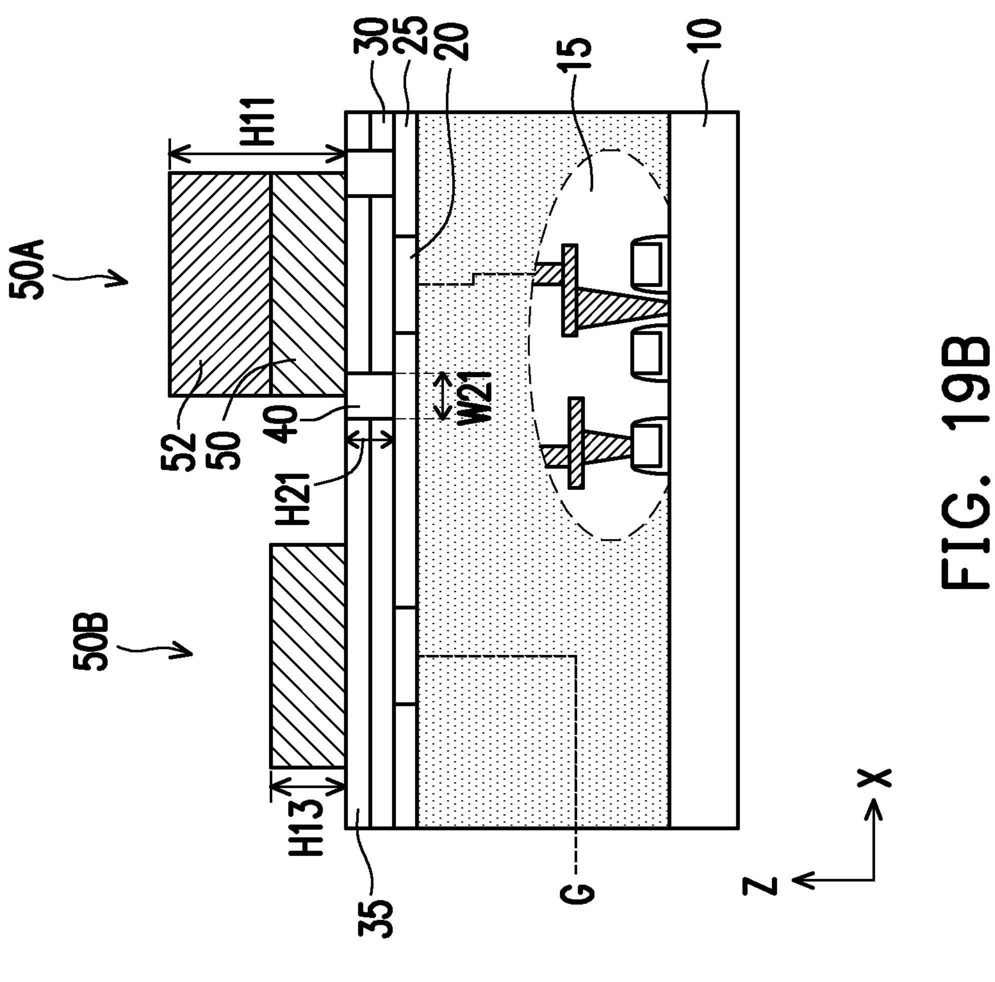
FIGS. 19A and 19B show one of the stages of a sequential manufacturing operation of a semiconductor device according to an embodiment of the present disclosure.
Figure 19A:
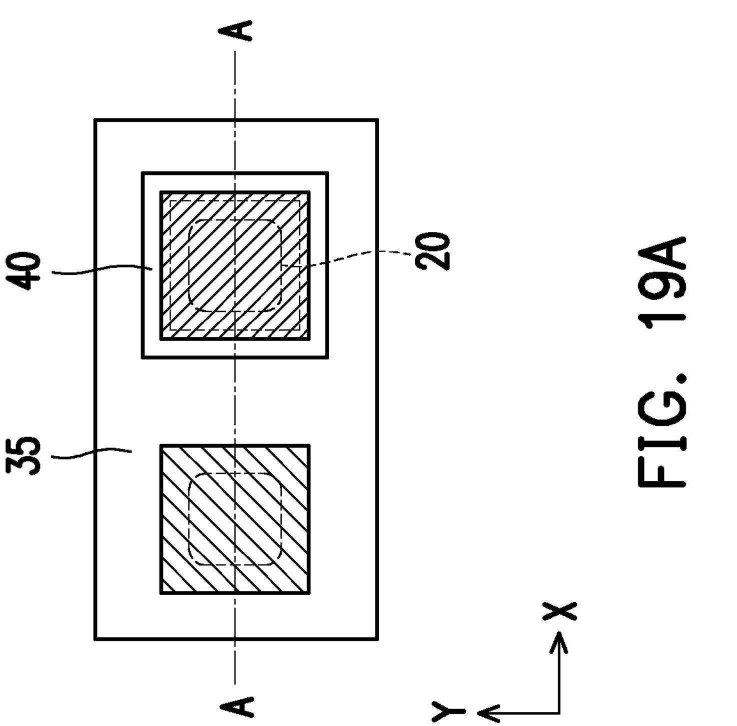

In some embodiments, when the second photoresist layer 58 is formed over the bump electrode 50 as shown in FIGS. 11A and 11B, the second photoresist layer 58 does not have a second opening 55 over either one of the bump electrodes 50, as shown in FIGS. 18A and 18B. Then, similar to the operations as explained with respect to FIGS. 12A-13B, one or more conductive materials 52 are deposited in the opening 55 to increase the thickness or height of the bump electrode 50A. Accordingly, as shown in FIGS. 19A and 19B, the height or the thickness of the bump electrode 50A is different from that of the bump electrode 50B. In some embodiments, the height H13 of the lower bump electrode is about 30% to about 80% of the height H11 of the higher bump electrode.

Figures 20A, 20B:
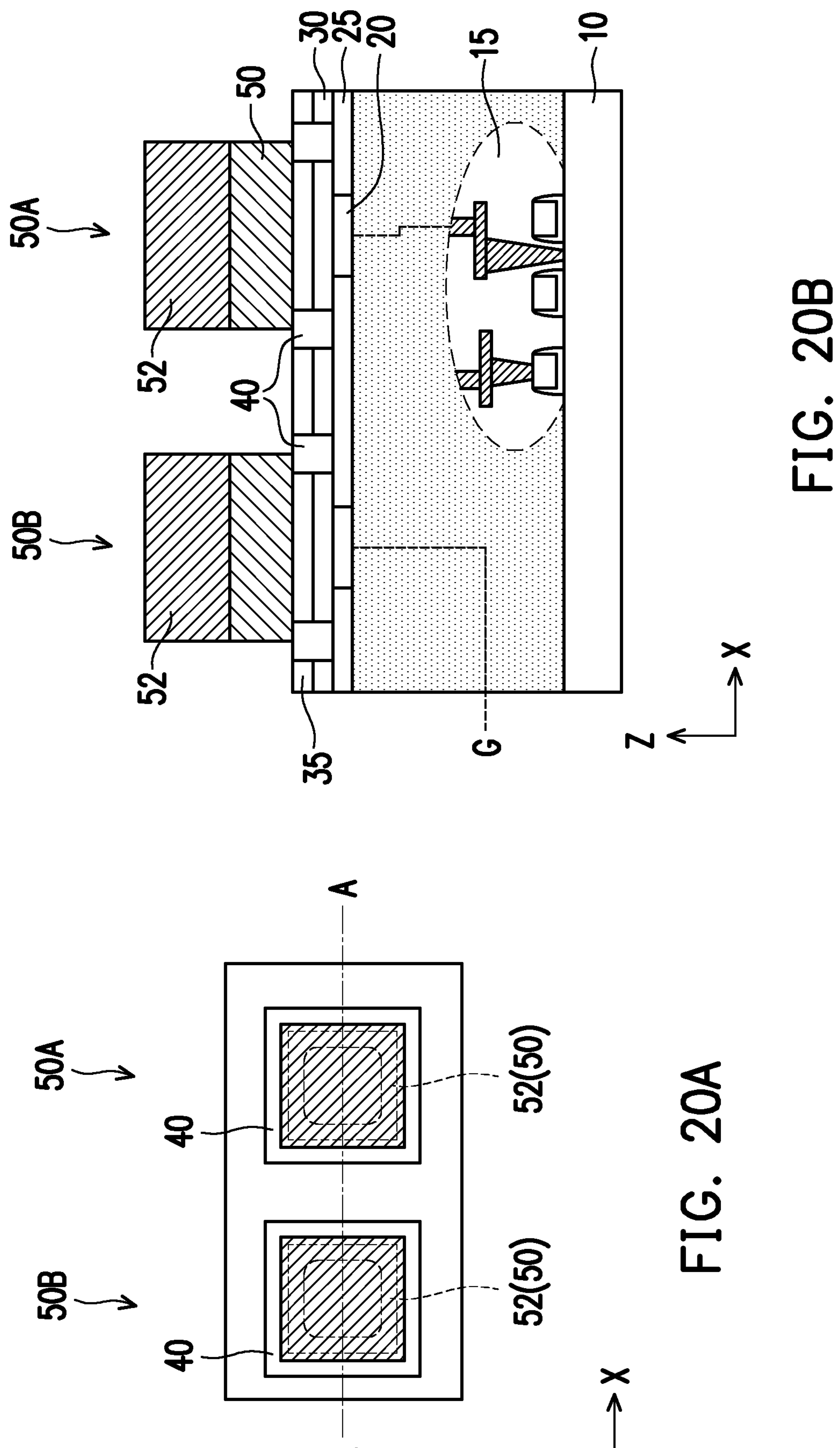
FIGS. 20A and 20B show one of the stages of a sequential manufacturing operation of a semiconductor device according to an embodiment of the present disclosure.

In some embodiments, as shown in FIGS. 20A and 20B, the isolation structure 40 is formed below both the bump electrodes 50A and 50B, so that the bump electrodes are individually electrically isolated.

Figures 20C, 20D:
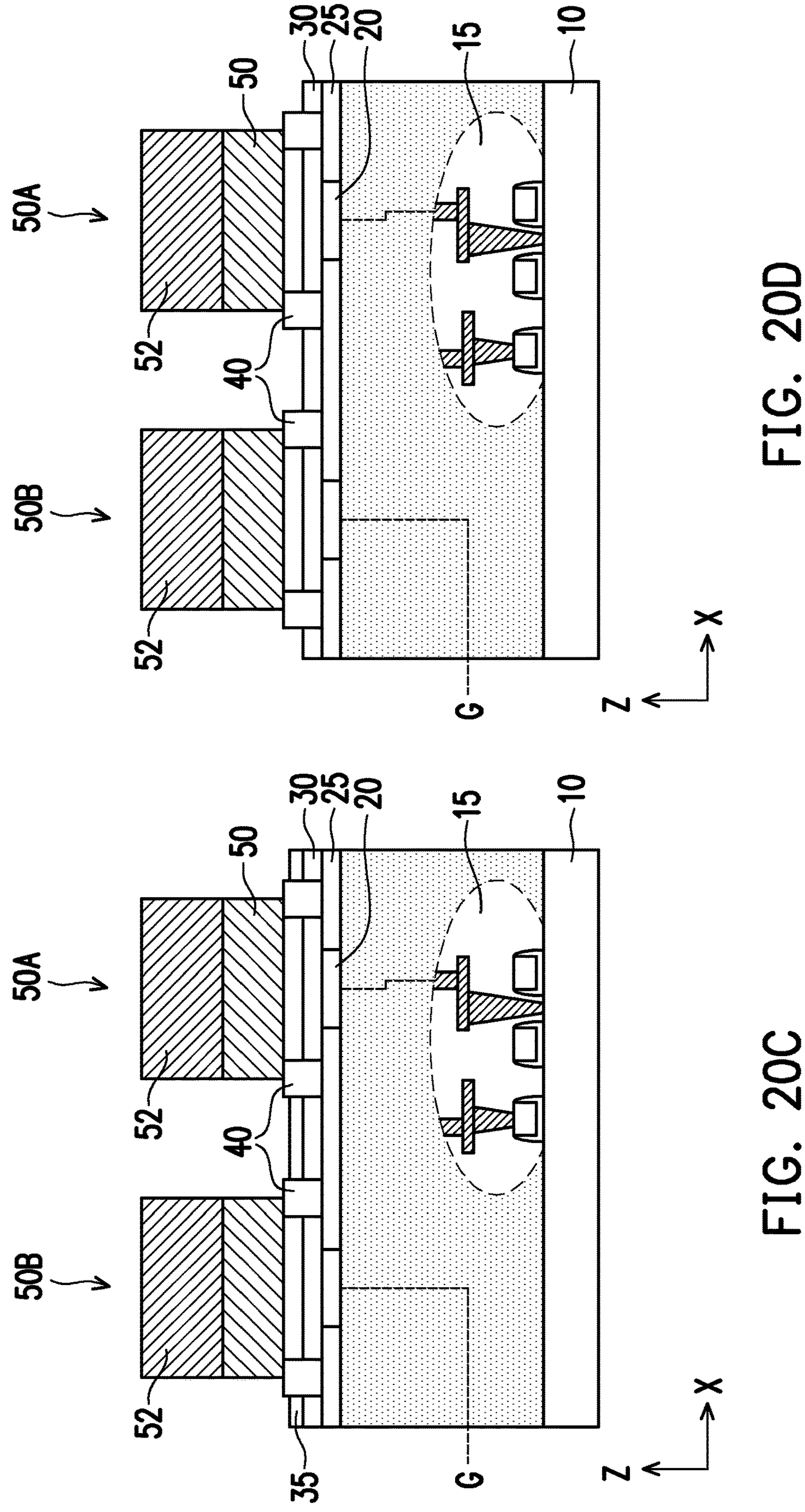
FIGS. 20C and 20D show one of the stages of a sequential manufacturing operation of a semiconductor device according to embodiments of the present disclosure.

In some embodiments, when the first main conductive layer SOL is patterned (etched), a part of the second conductive layer 35 is also etched, and the second conductive layer 35 has a first thickness under the bump electrode and a second thickness outside the bump electrode smaller than the first thickness as shown in FIG. 20C.

In some embodiments, when the first main conductive layer SOL is patterned (etched), the second conductive layer 35 is fully etched, no second conductive layer 35 is disposed outside the bump electrode as shown in FIG. 20D. Further, in some embodiments, when the first main conductive layer SOL is patterned (etched), the second conductive layer 35 is fully etched and a part of the first conductive layer 30 is also etched, and the first conductive layer 30 has a first thickness under the bump electrode and a second thickness outside the bump electrode smaller than the first thickness. The isolation structure 40 functions as an etch stop layer when the first main conductive layer SOL is patterned (etched).

FIGS. 21A and 21B to 29A and 29B show various views of a sequential manufacturing operation of a bump structure over a semiconductor circuit according to an embodiment of the present disclosure. It is understood that additional operations can be provided before, during, and after processes shown by FIGS. 21A-29B, and some of the operations described below can be replaced or eliminated, for additional embodiments of the method. The order of the operations/processes may be interchangeable. In FIGS. 21A and 21B to 29A and 29B, the "A" figures show a plan view (a top view or a projected view) and the "B" figures show a cross sectional view along line A-A of the "A" figures.

Materials, methods, processes, dimensions and/or configuration of one embodiment can be applied to one or more other embodiments, and the detailed description thereof may be omitted.

Figure 21B:
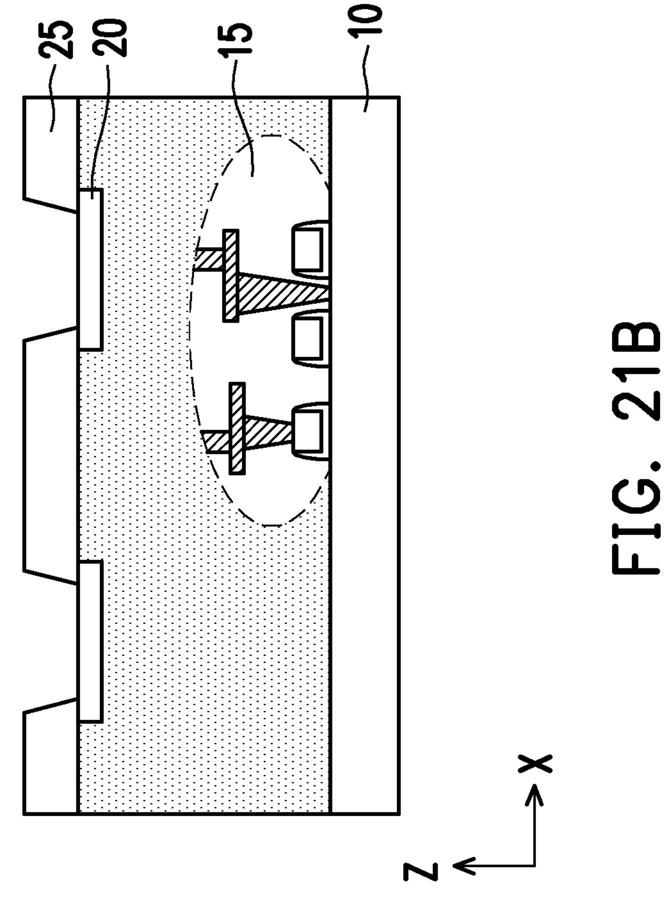
FIGS. 21A and 21B show one of the stages of a sequential manufacturing operation of a semiconductor device according to an embodiment of the present disclosure.
Figure 21A:
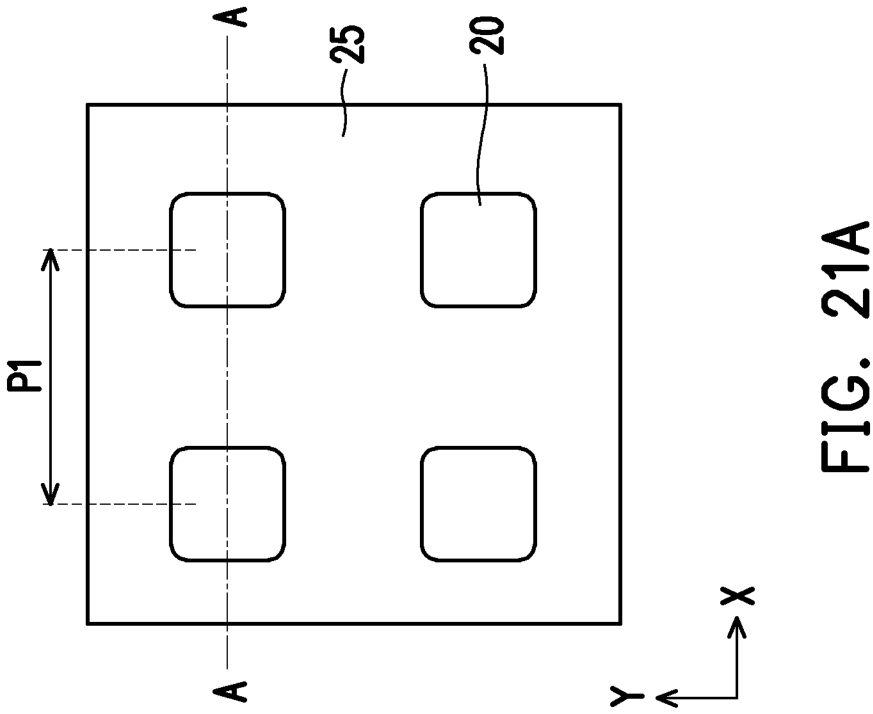

As shown in FIGS. 21A and 21B, a plurality of pad electrodes 20, on which bump structures are to be formed, are arranged over a semiconductor circuit 15 formed on a substrate 10. The pad electrodes 20 are arranged in a row-column arrangement in some embodiments. In some embodiments, the pad electrodes 20 have a width ranging from about 10 μm to about 500 μm as seen in plan view. In other embodiments, the pad electrodes 20 have a width ranging from about 20 μm to about 100 μm. In some embodiments, the plurality of pad electrodes 20 are arranged in a row-column arrangement having a pitch P1 of about 20 μm to about 100 μm. In some embodiments, the pitch along the X direction is the same as or different from the pitch along the Y direction. A 2×2 arrangement of the pad electrodes 20 is illustrated, but the disclosure is not limited to a 2×2 arrangement.

In some embodiments, one or more passivation layer 25 are formed over the pad electrodes 20 as shown in FIGS. 21A and 21B. The passivation layer 25 is patterned using suitable photolithography and etching operations to form openings, in which part of the pad electrodes are exposed as shown in FIGS. 21A and 21B. In some embodiments, the opening has a tapered shape as shown in FIG. 21B.

Figure 22B:
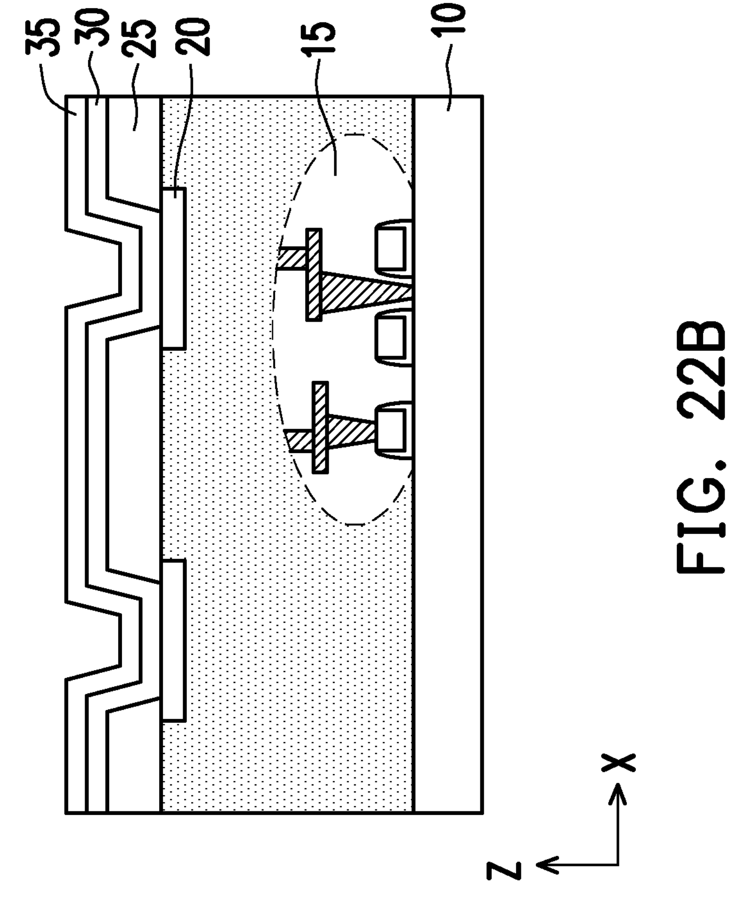
FIGS. 22A and 22B show one of the stages of a sequential manufacturing operation of a semiconductor device according to an embodiment of the present disclosure.
Figure 22A:
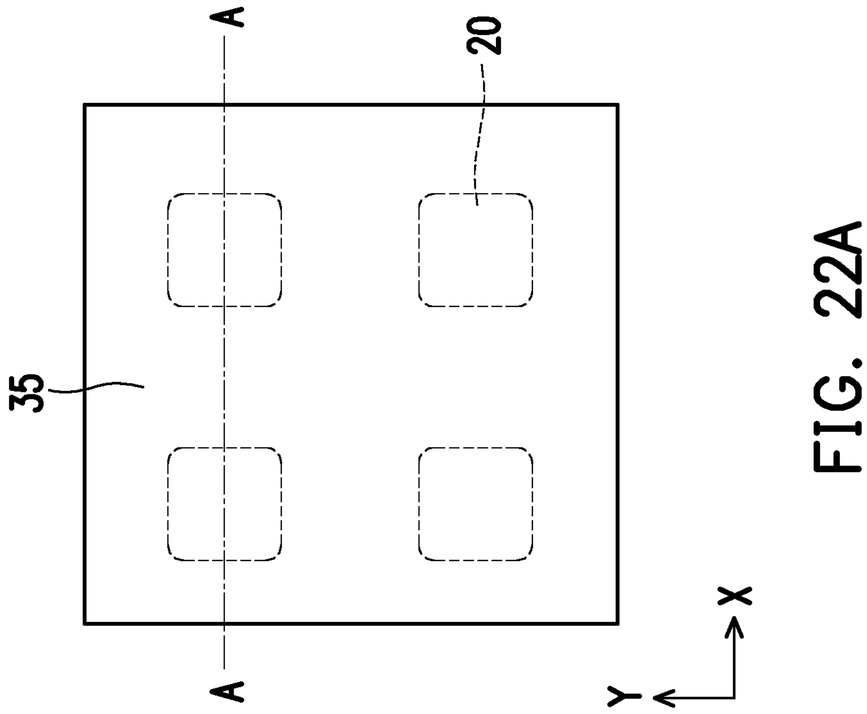

Then, as shown in FIGS. 22A and 22B, one or more conductive layers, as UBM layers, are formed over the passivation layer 25 and the exposed pad electrodes 20. In some embodiments, the UBM layers include an underlying conductive layer (a first conductive layer) 30 and a seed layer (a second conductive layer) 35 formed on the underlying conductive layer 30. In some embodiments, the underlying conductive layer includes Ti, TiN or TiW, and the seed layer 35 includes copper or a copper alloy. In some embodiments, each of the underlying conductive layer 30 and the seed layer 35 has a thickness ranging from about 20 nm to about 100 nm.

Figure 23B:
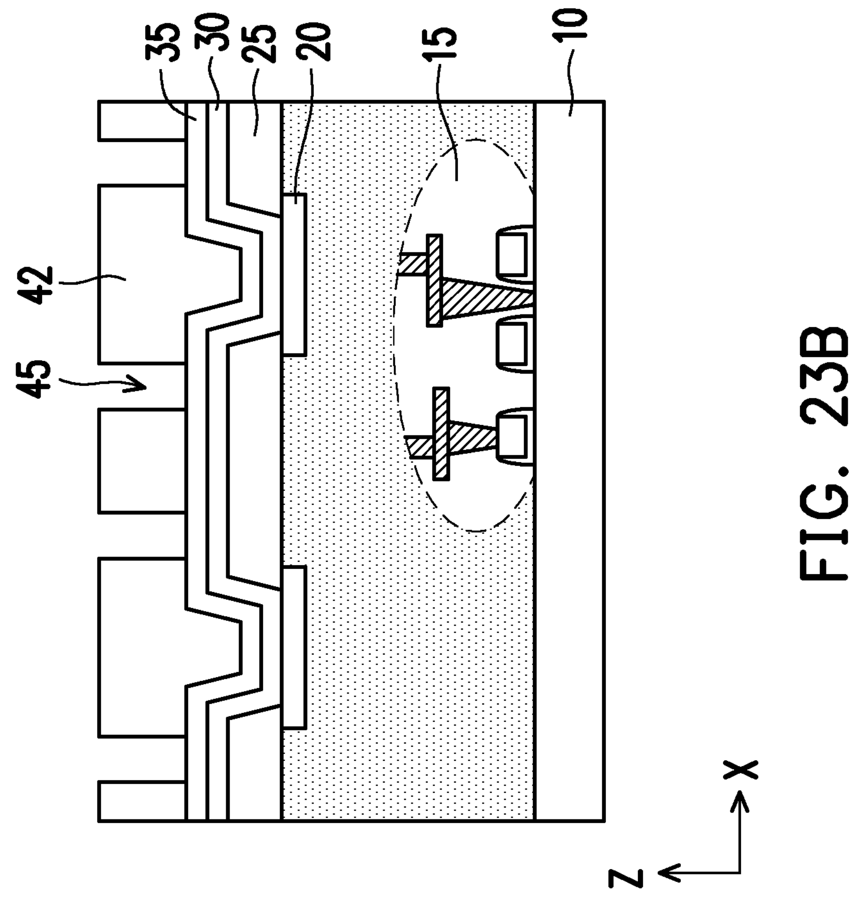
FIGS. 23A and 23B show one of the stages of a sequential manufacturing operation of a semiconductor device according to an embodiment of the present disclosure.
Figure 23A:
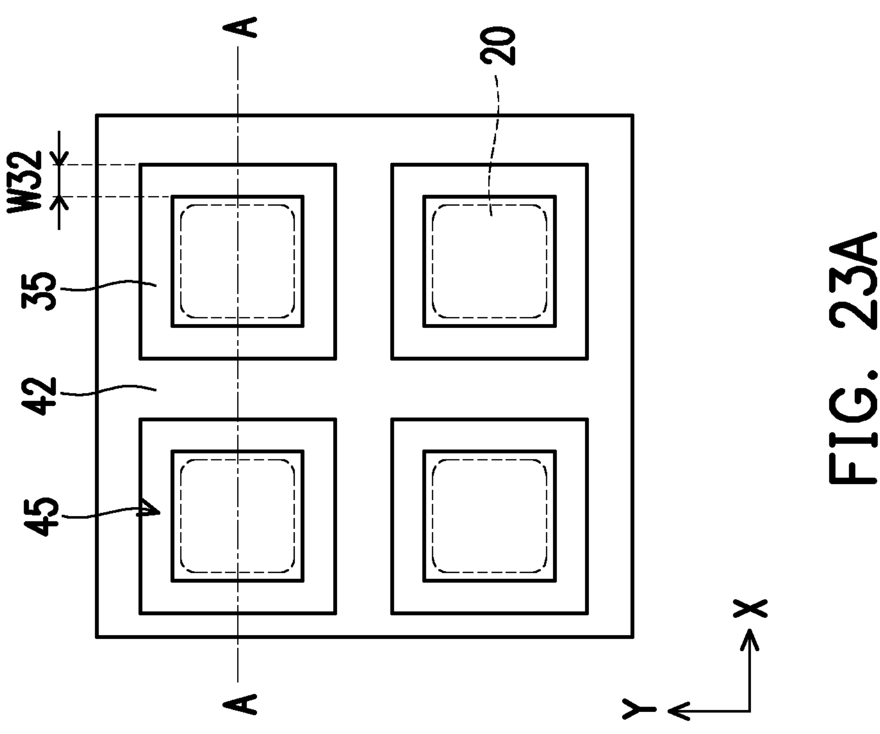

Next, a photoresist layer 42 is formed over the first and second conductive layers 30, 35, as shown in FIGS. 23A and 23B. The photoresist layer 42 is subsequently selectively exposed to actinic radiation, and developed to form a plurality of first openings 45 exposing the second conductive layer 35, as shown in FIGS. 23A and 23B. In some embodiments, the first opening 45 has a ring or a frame shape as shown in FIG. 23A. In some embodiments, the first opening 45 surrounds the pad electrode 20 in plan view. In other embodiments, the first opening 45 overlaps the periphery of the pad electrode 20. In certain embodiments, the periphery of the pad electrode is located outside the first opening 45. The width W32 of the first opening 45 is in a range from about 0.1 μm to about 1 μm in some embodiments.

Figure 24B:
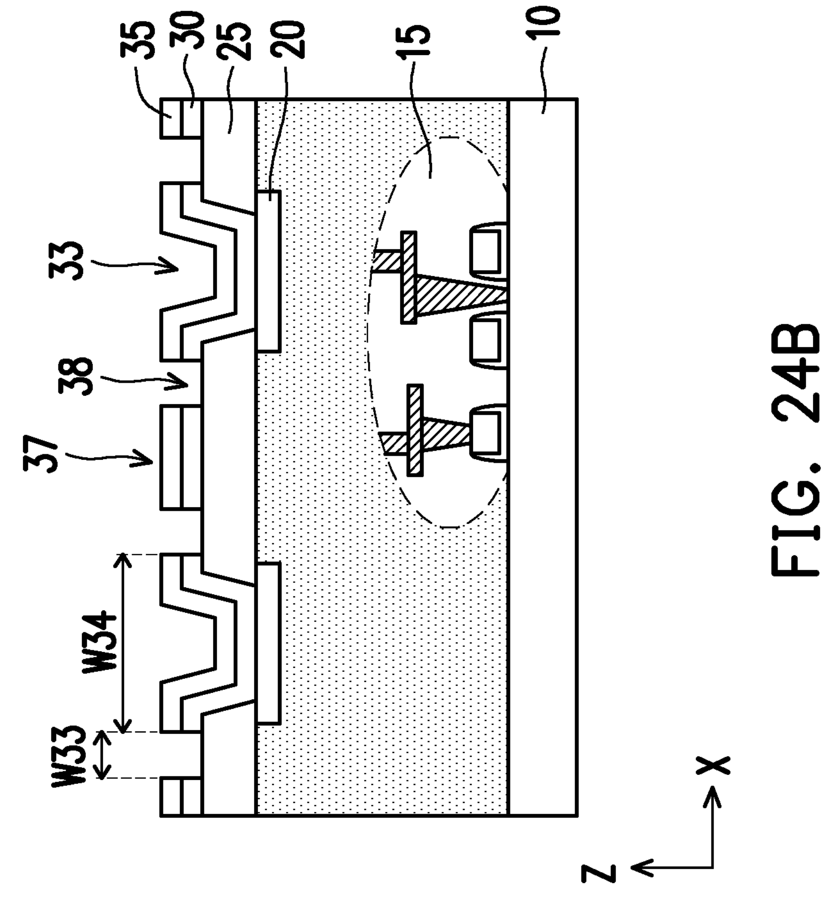
FIGS. 24A and 24B show one of the stages of a sequential manufacturing operation of a semiconductor device according to an embodiment of the present disclosure.
Figure 24A:
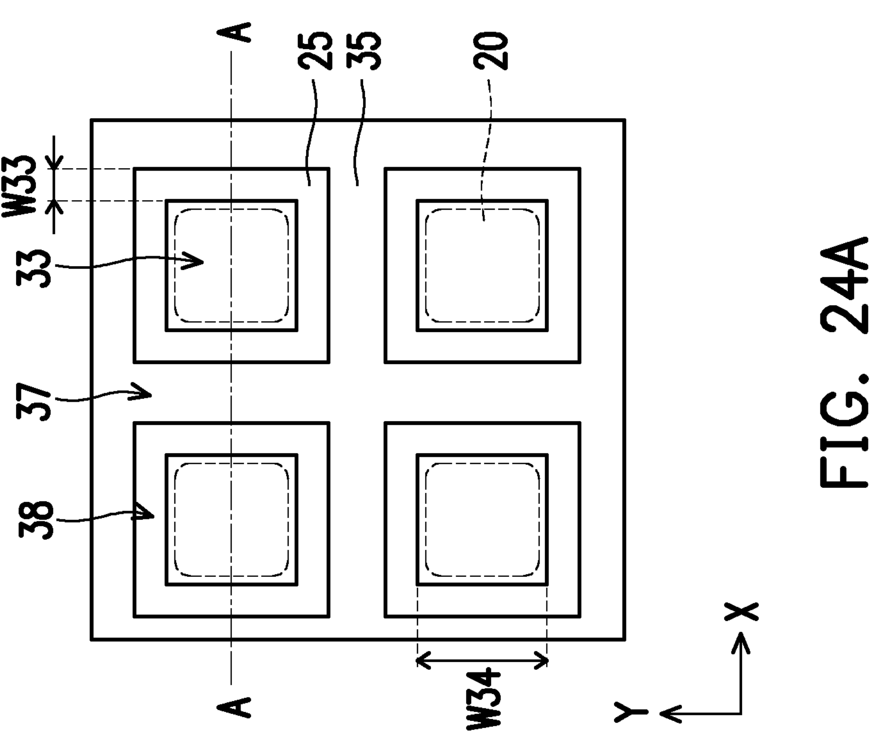

Then, as shown in FIGS. 24A and 24B, the first and second conductive layers 30 and 35 are patterned by using the photoresist layer 42 as an etching mask. The etching includes one or more of dry etching and wet etching. As shown in FIGS. 24A and 24B, a groove 38 is formed to surround an island pattern 33 of the first and second conductive layers 30 and 35, under which the pad electrode 20 is disposed.

Each of the island patterns of the first and second conductive layers 30 and 35 is electrically isolated from a remaining area of the first and second conductive layers by the groove 38. In some embodiments, the width W33 of the groove 38 is in a range from about 0.1 μm to about 1 μm. In some embodiments, the width W34 of the island pattern 33 is in a range from about 1 μm to about 10 μm, and is in a range from about 2 μm to about 5 μm in other embodiments. The photoresist layer 42 is removed by using a suitable photoresist stripper solution or by an oxygen plasma ashing operation.

Figure 25B:
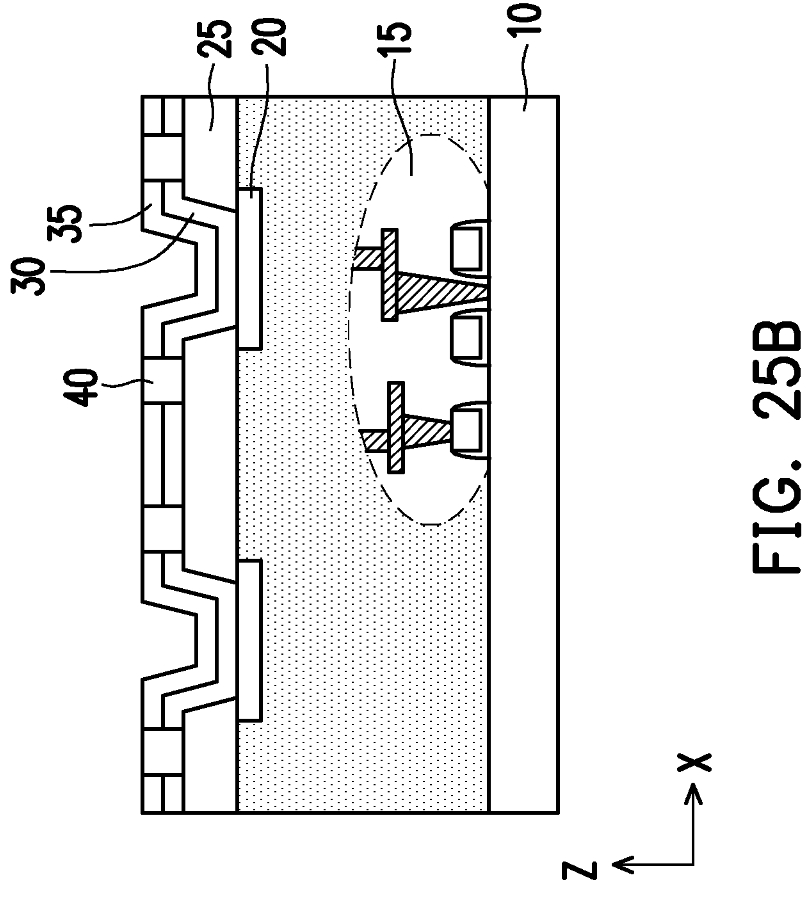
FIGS. 25A and 25B show one of the stages of a sequential manufacturing operation of a semiconductor device according to an embodiment of the present disclosure.
Figure 25A:
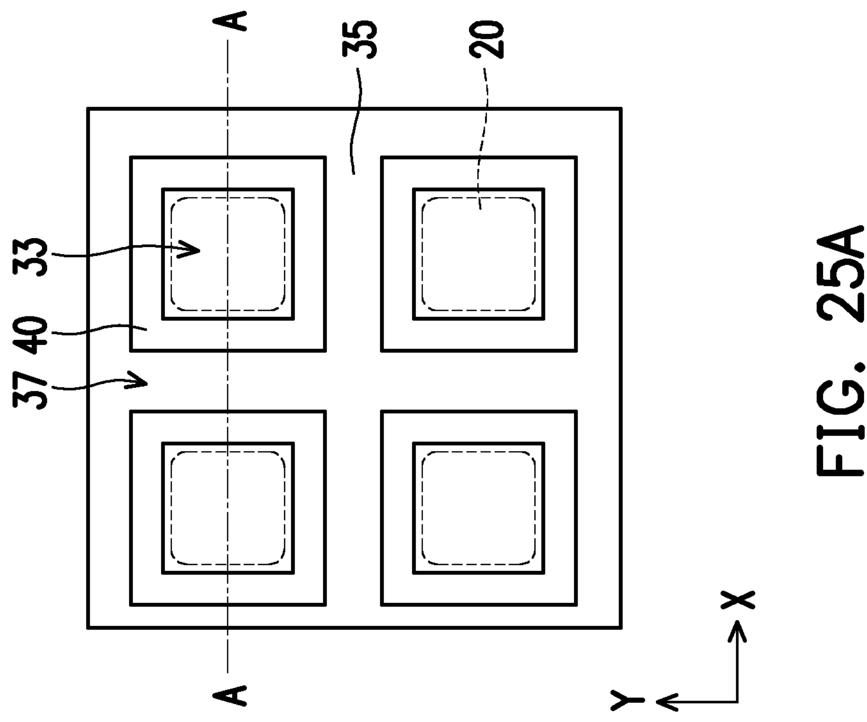

Then, as shown in FIGS. 25A and 25B, an isolation structure 40 is formed, similar to the operations as explained with respect to FIGS. 6A-7B.

Figure 26B:
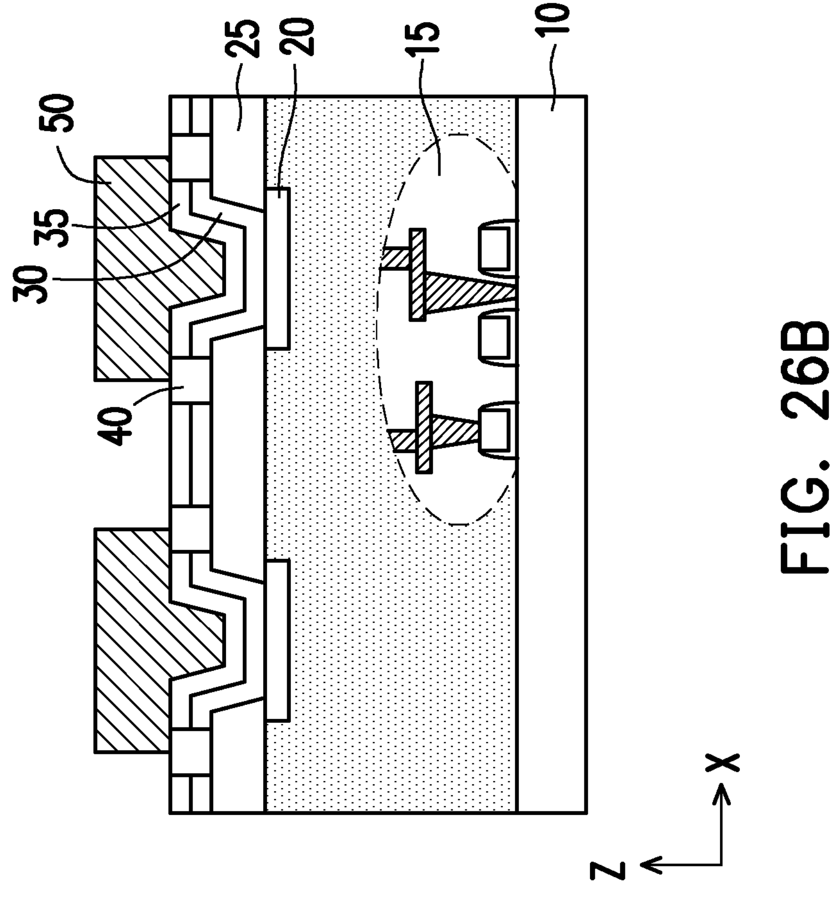
FIGS. 26A and 26B show one of the stages of a sequential manufacturing operation of a semiconductor device according to an embodiment of the present disclosure.
Figure 26A:
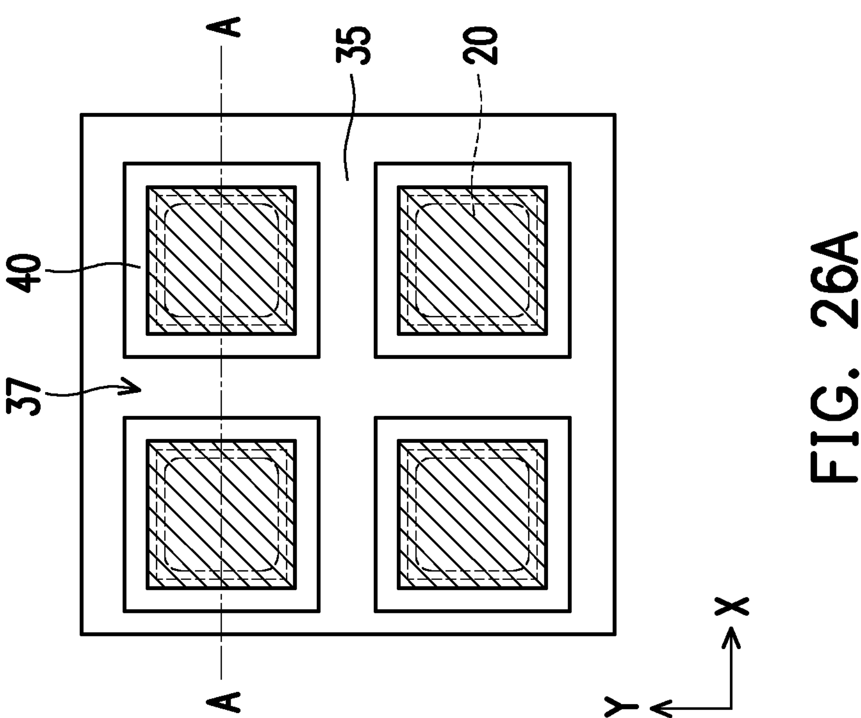

Next, as shown in FIGS. 26A and 26B, a lower portion of the bump electrodes 50 is formed similar to the operations as explained with respect to FIGS. 8A-9B. In some embodiments, an upper portion of the bump electrodes are formed similar to the operations as explained with respect to FIGS. 10A-13B.

Figure 27B:
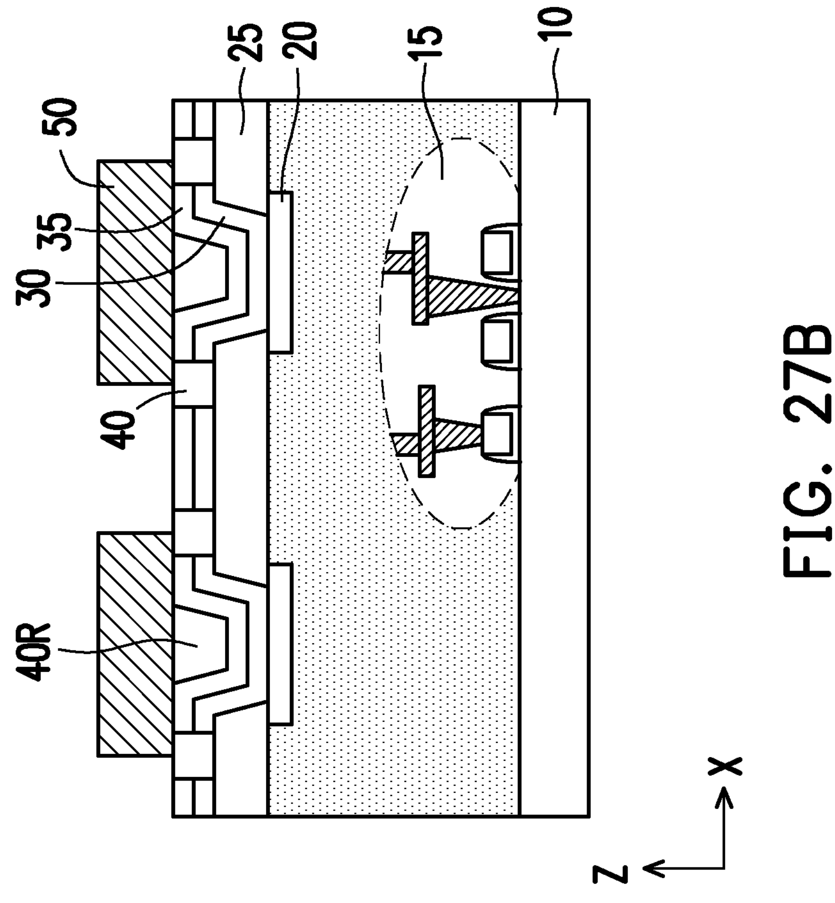
FIGS. 27A and 27B show one of the stages of a sequential manufacturing operation of a semiconductor device according to an embodiment of the present disclosure.
Figure 27A:
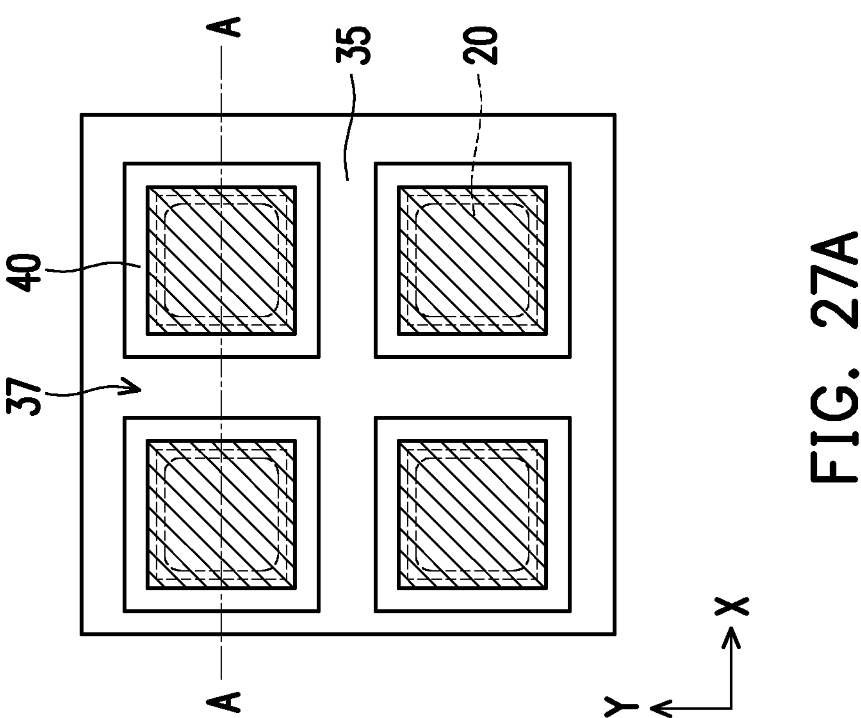

In some embodiments, as shown in FIGS. 27A and 27B, a part of the insulating material 40R remains at the concave or recessed portion of the first and second conductive layers 30, 35 over an opening formed in the passivation layer 25, and the bump electrodes 50 are formed over the remaining insulating layer 40R.

Figure 28B:
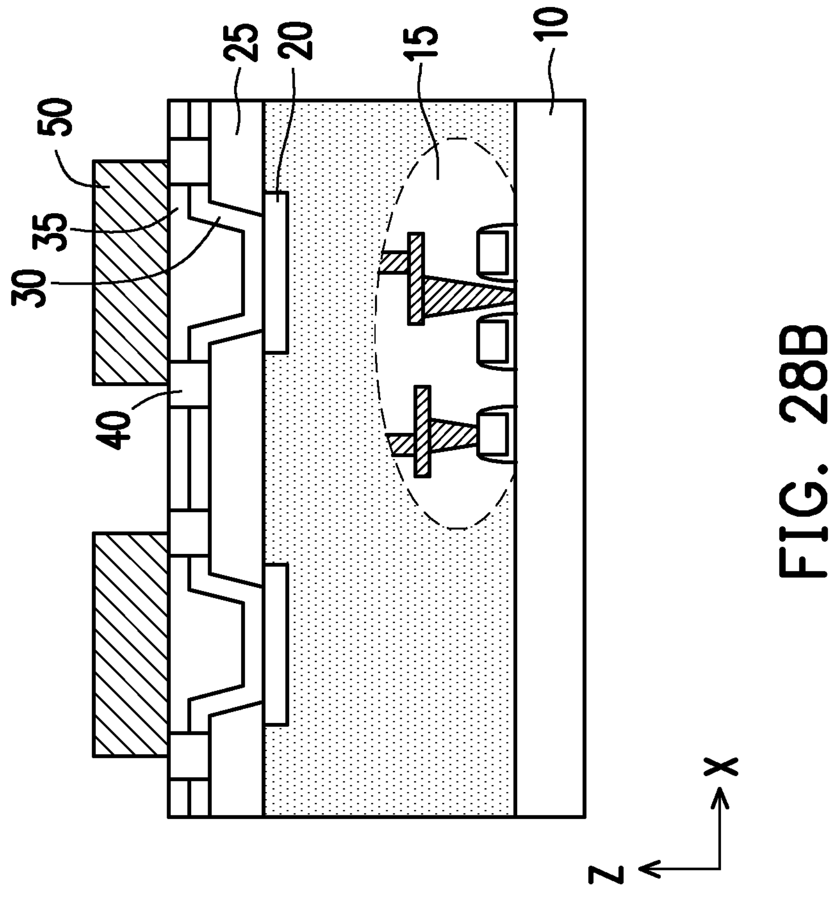
FIGS. 28A and 28B show one of the stages of a sequential manufacturing operation of a semiconductor device according to an embodiment of the present disclosure.
Figure 28A:
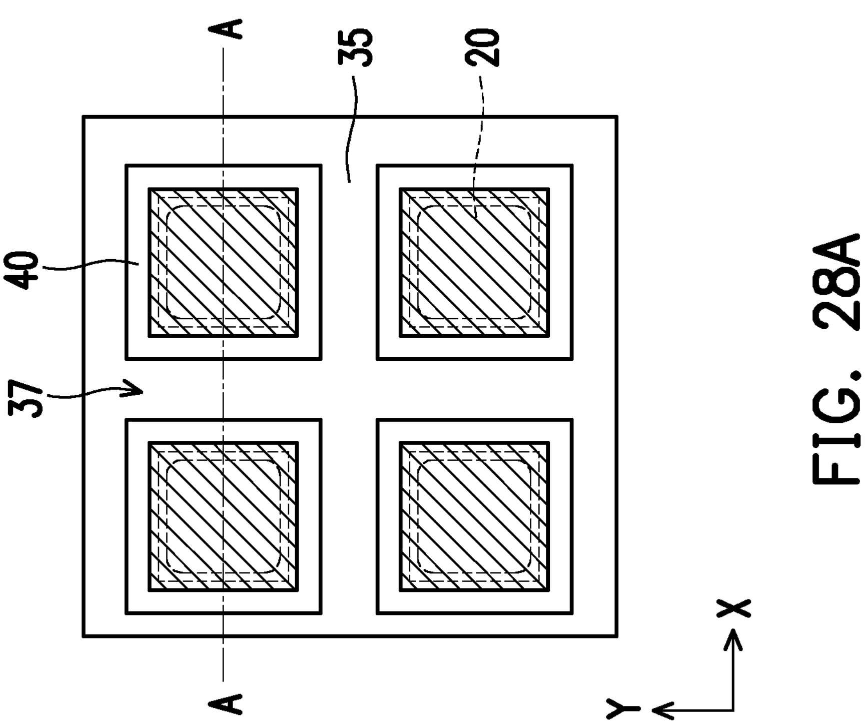

In some embodiments, one or more of the size of the opening in the passivation layer 25, the thickness of the UBM layers (the first conductive layers 30 and/or the second conductive layer 35) and/or forming conditions of the UBM layers are adjusted so that substantially no concave or recessed portion of the first and second conductive layers 30, 35 is formed. Thus, as shown in FIGS. 28A and 28B, no remaining portion 40R of the insulating layer is disposed below the bump electrodes 50 over the opening in the passivation layer 35. layer 35) and/or forming conditions of the UBM layers are adjusted so that substantially no concave or recessed portion of the first and second conductive layers 30, 35 is formed. Thus, as shown in FIGS. 28A and 28B, no remaining portion 40R of the insulating layer is disclosed below the bump electrodes 50 over the opening in the passivation layer 35.

Figure 29B:
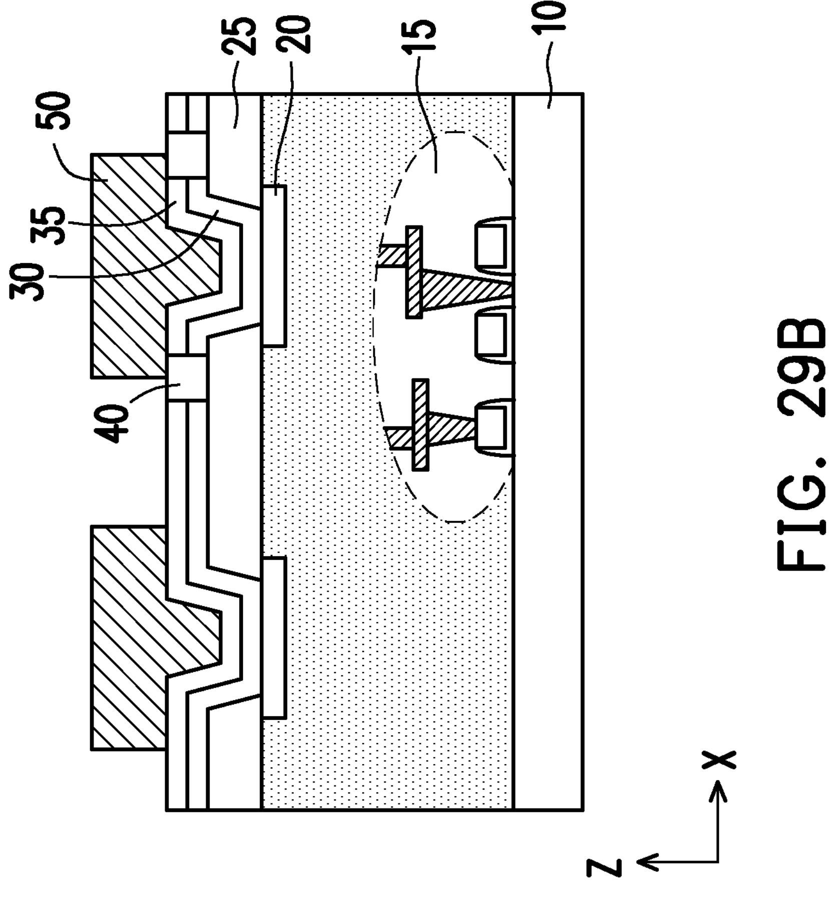
FIGS. 29A and 29B show one of the stages of a sequential manufacturing operation of a semiconductor device according to an embodiment of the present disclosure.
Figure 29A:
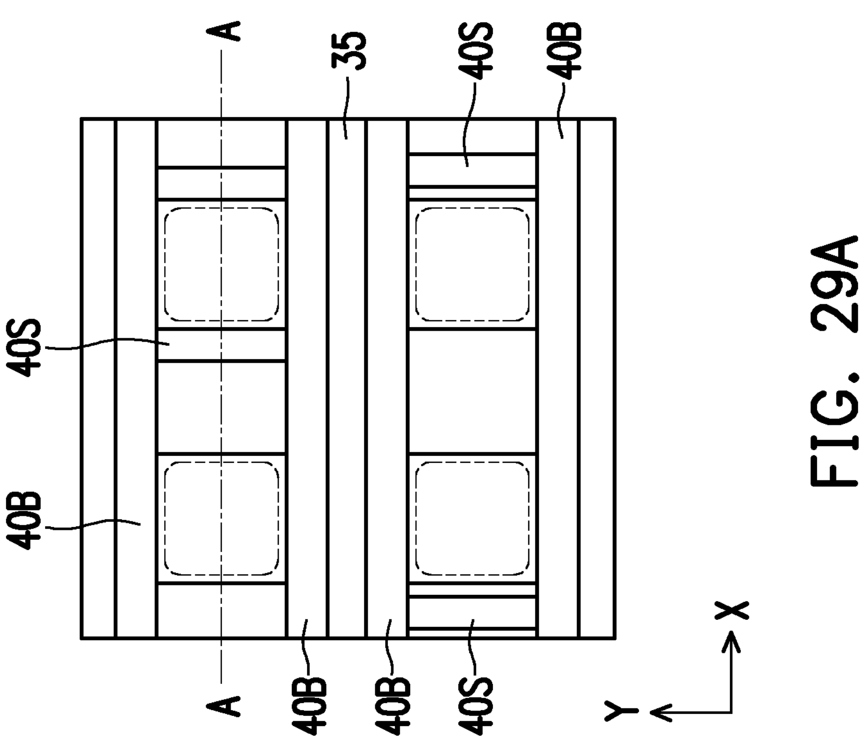

In some embodiments, the isolation structure includes bus portions 40B, between which the underlying pad electrodes 20 and the island patterns 33 are disposed in plan view, and branch portions 40S connecting the bus portions such that one or more of the bump electrodes are electrically isolated from each other, as shown in FIGS. 29A and 29B. In FIG. 29A, the bump electrodes are omitted.

FIGS. 30-34 show various stages of a sequential manufacturing operation of a bump structure over a semiconductor circuit according to an embodiment of the present disclosure. It is understood that additional operations can be provided before, during, and after processes shown by FIGS. 30-34, and some of the operations described below can be replaced or eliminated, for additional embodiments of the method. The order of the operations/processes may be interchangeable. Materials, methods, processes, dimensions and/or configuration of one embodiment can be applied to one or more other embodiments, and the detailed description thereof may be omitted.

Figures 30, 31:
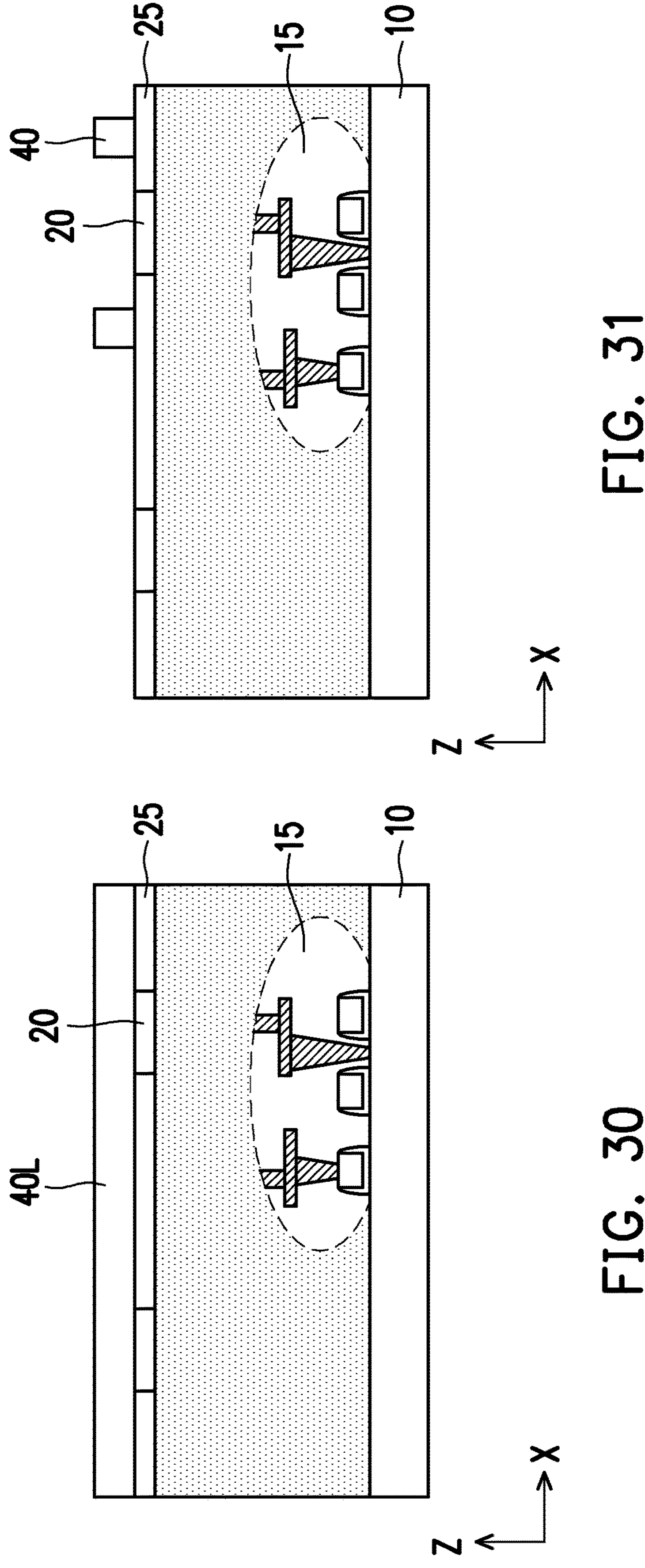
FIGS. 30, 31, 32, 33 and 34 show various stages of a sequential manufacturing operation of a semiconductor device according to an embodiment of the present disclosure.
Figures 32, 33:
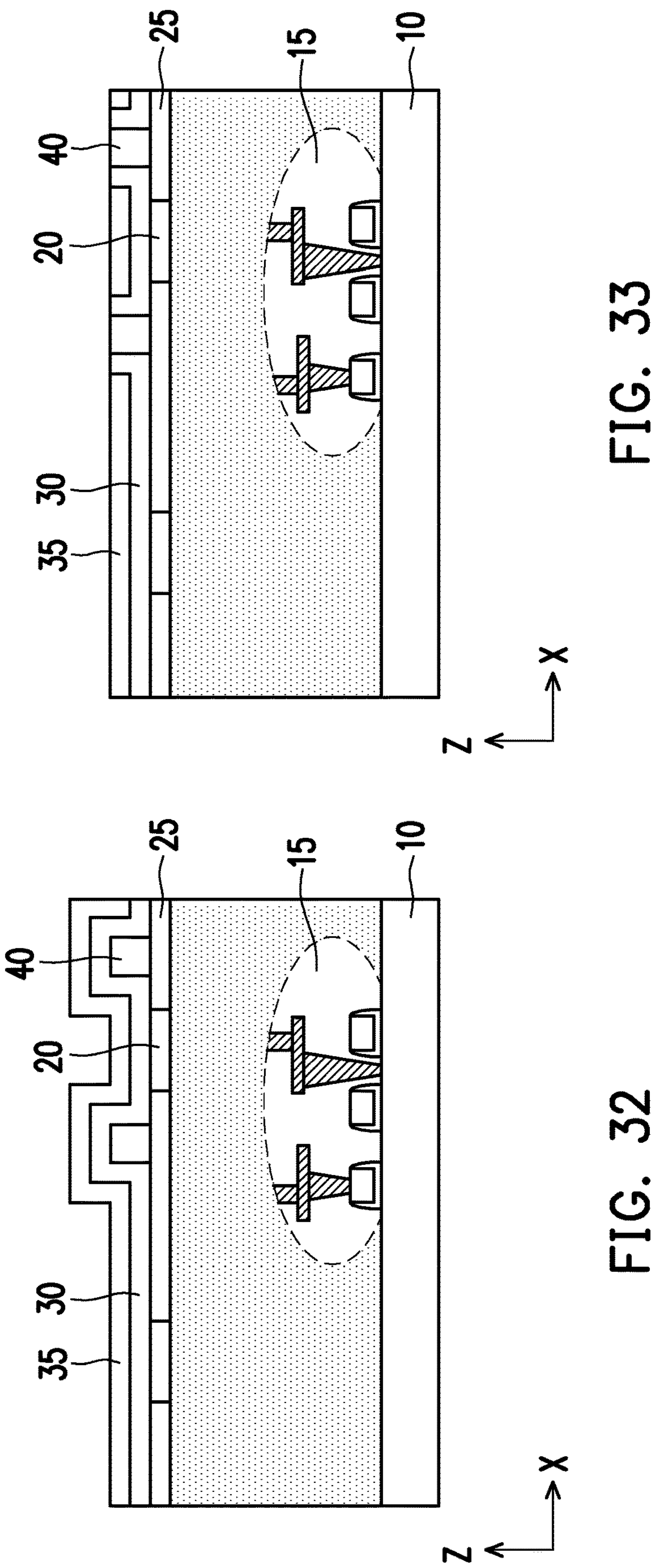
Figure 34:
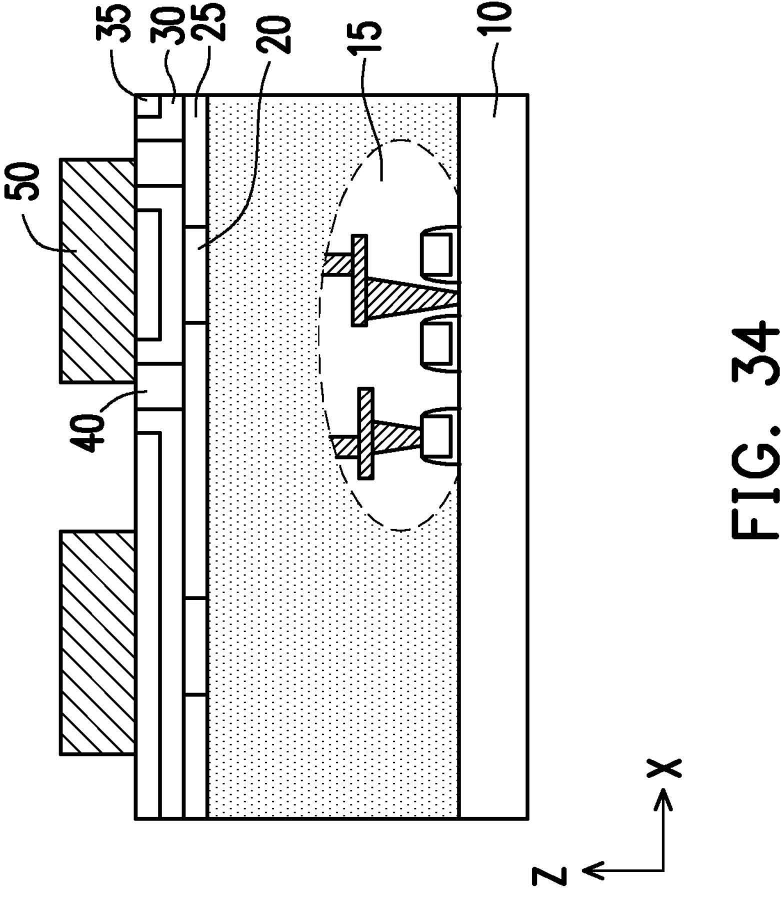

In some embodiments, as shown in FIG. 30, an insulating layer 40L is formed to over the passivation layer 25 and pad electrode 20. Then, as shown in FIG. 31, an isolation structure 40 is formed by using one or more lithography and etching operations. After the isolation structure 40 is formed, the first conductive layer 30 and the second conductive layer 35 are formed over the passivation layer 25 and the isolation structure 40 as shown in FIG. 32. Then, one or more planarization operations, such as CMP, are performed to expose the upper surface of the isolation structure 40 as shown in FIG. 33. Then, similar to the operations as explained with respect to FIGS. 8A-9B, bump electrodes 50 are formed as shown in FIG. 34.

Figure 35:
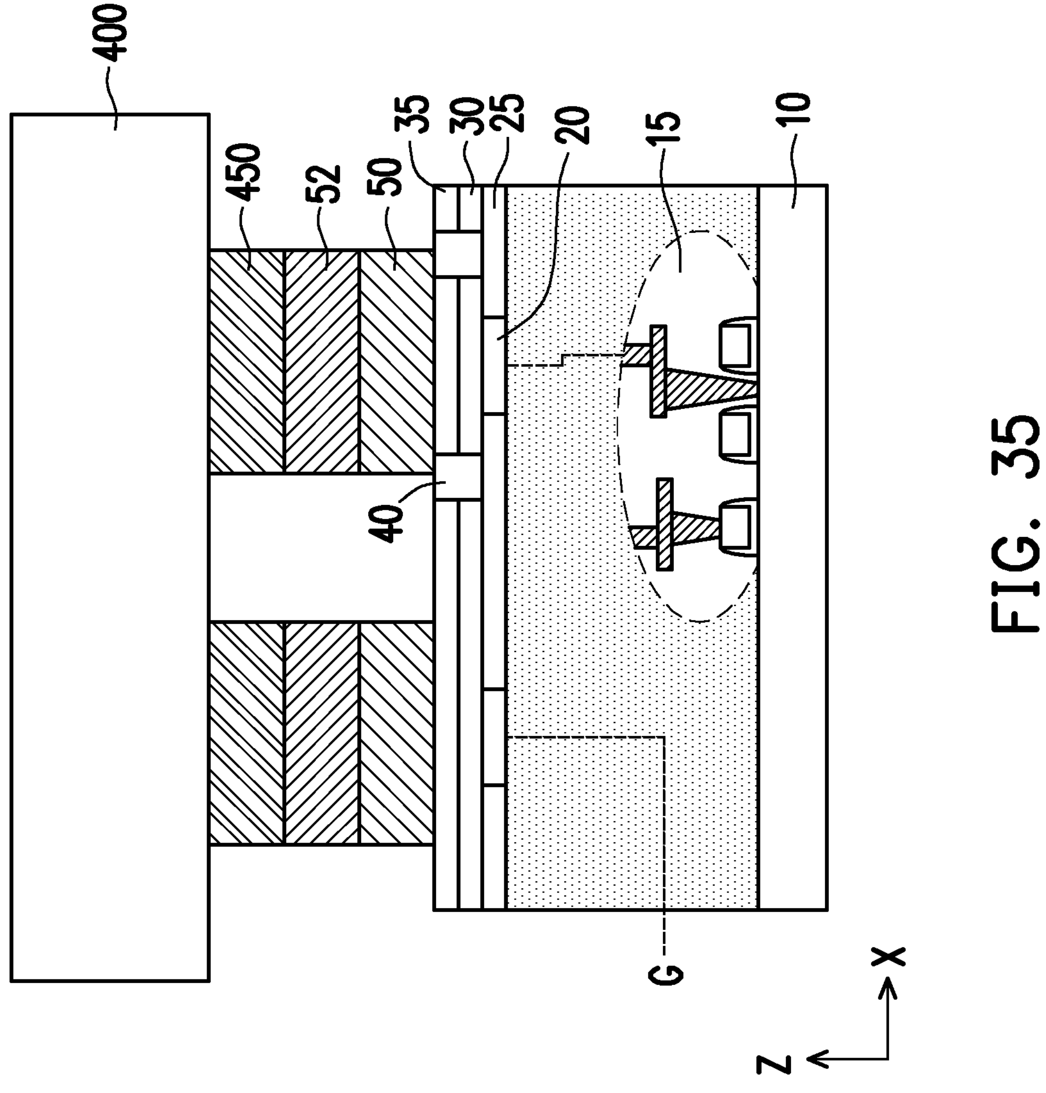
FIG. 35 is a cross-sectional view of a MEMS and a semiconductor device according to an embodiment of the present disclosure.

In some embodiments, as shown in FIG. 35, a MEMS structure 400 having bump electrodes 450 are attached to the circuit substrate having the bump electrode 50 as set forth above, for example, as shown in FIG. 13A, 15B, 17B, 19B, 20B, 26B, 27B, 28B, 29B or 34.

In the present disclosure, a bump electrode is formed over an isolation structure made of a low-k dielectric material (other than air or gas), which improves a mechanical strength of the bump electrode while maintaining a low parasitic capacitance under the bump. In addition, since the isolation structure functions as an etch stop layer, it can void creating undesirable recess around the bump electrode.

It will be understood that not all advantages have been necessarily discussed herein, no particular advantage is required for all embodiments or examples, and other embodiments or examples may offer different advantages.

In accordance with an aspect of the present disclosure, a semiconductor device includes a substrate, one or more wiring layers disposed over the substrate, a passivation layer disposed over the one or more wiring layers, a first conductive layer disposed over the passivation layer, a second conductive layer disposed over the first conductive layer, an isolation structure formed in the first and second conductive layers to isolate a part of the first and second conductive layers, and a first metal pad disposed over the isolation structure and the part of the first and second conductive layers. In one or more of the foregoing or following embodiments, the semiconductor device further includes a second metal pad disposed over the second conductive layer and electrically isolated from the first metal pad. In one or more of the foregoing or following embodiments, the isolation structure has a ring or a frame shape in plan view. In one or more of the foregoing or following embodiments, the semiconductor device further includes a transistor, and the first metal pad is coupled to the transistor through a part of the one or more wiring layers. In one or more of the foregoing or following embodiments, the second metal pad is coupled to a ground potential. In one or more of the foregoing or following embodiments, the first and second metal pads are made of one of Cu, Al, Au, Ti or a compound thereof. In one or more of the foregoing or following embodiments, the isolation structure includes a trench formed in the first and second conductive layers and an insulating material filled in the trench. In one or more of the foregoing or following embodiments, the insulating material includes one or more of silicon oxide, SiON, SiOC, SiOCN or SiCN. In one or more of the foregoing or following embodiments, the insulating material includes an organic resin. In one or more of the foregoing or following embodiments, the passivation layer includes one or more of silicon nitride, SiON, SiOCN or SiCN.

In accordance with another aspect of the present disclosure, a semiconductor device includes a substrate, one or more wiring layers disposed over the substrate, a passivation layer disposed over the one or more wiring layers, one or more conductive layers disposed over the passivation layer, an isolation structure formed in the one or more conductive layers to isolate a part of the one or more conductive layers, a first metal pad disposed over the isolation structure and the part of the one or more conductive layers, and a second metal pad disposed over the one or more conductive layers and electrically isolated from the first metal pad. In one or more of the foregoing or following embodiments, the semiconductor device further includes a transistor and a first conductive pattern disposed in the passivation layer. The first metal pad is coupled to the transistor through the first conductive pattern and a part of the one or more wiring layers. In one or more of the foregoing or following embodiments, a thickness of the first and second metal pads is in a range from 10 μm to 80 μm. In one or more of the foregoing or following embodiments, a width W of the first and second metal pads is in a range from 1 μm to 5 μm. In one or more of the foregoing or following embodiments, a space S between the first metal pad and the second metal pad is in a range from 1 μm to 5 μm. In one or more of the foregoing or following embodiments, a value (W+S)/S is more than 1. In one or more of the foregoing or following embodiments, a part of the isolation structure is exposed from the first metal pad. In one or more of the foregoing or following embodiments, no isolation structure is disposed in the one or more conductive layers below the second metal pad.

In accordance with another aspect of the present disclosure, a semiconductor device includes a substrate, one or more wiring layers disposed over the substrate, a passivation layer disposed over the one or more wiring layers, one or more conductive layers disposed over the passivation layer, a first isolation structure formed in the one or more conductive layers to isolate a part of the one or more conductive layers, and a first metal pad disposed over the first isolation structure and the part of the one or more conductive layers. The first isolation structure includes a trench having a ring or a frame shape in plan view and formed in the one or more conductive layers, and an insulating material filled in the trench. In one or more of the foregoing or following embodiments, the insulating material includes one or more of SiOC, SiOCN, SiCN or polyimide. In one or more of the foregoing or following embodiments, the trench has a tapered shape in a cross sectional view having a top width greater than a bottom width. In one or more of the foregoing or following embodiments, the semiconductor device further includes a second metal pad disposed over the one or more conductive layers and electrically isolated from the first metal pad. In one or more of the foregoing or following embodiments, the semiconductor device further includes a second isolation structure formed in the one or more conductive layers to isolate another part of the one or more conductive layers below the second metal pad. In one or more of the foregoing or following embodiments, the trench is formed in the passivation layer.

In accordance with another aspect of the present disclosure, a semiconductor device includes a transistor, an interconnect structure disposed over and electrically coupled to the transistor, a passivation layer disposed on the interconnect structure, a metal stack disposed on the interconnect structure, a pair of insulator plugs disposed in the metal stack and separated from each other, and a metal pad, disposed on the pair of insulator plugs, wherein the metal pad is at least electrically coupled to the transistor through the interconnect structure and the metal stack.

In accordance with another aspect of the present disclosure, in a method of manufacturing a semiconductor device, a circuit structure is prepared over a substrate, one or more conductive layers are formed over the circuit structure, a trench pattern is formed by patterning the one or more conductive layers, an isolation structure is formed by filling the trench pattern with an insulating material, an upper conductive layer is formed over the one or more conductive layers and the isolation structure, and a first metal pad is formed by patterning the upper conductive layer so that the first metal pad is disposed over the isolation structure. In one or more of the foregoing or following embodiments, a thickness of the first metal pad is increases. In one or more of the foregoing or following embodiments, when the thickness of the first metal pad is increased, a mask pattern is formed over the one or more conductive layers having an opening over the first metal pad, and an additional layer is formed over the first metal pad by electroplating. In one or more of the foregoing or following embodiments, the isolation structure has a ring or a frame shape in plan view. In one or more of the foregoing or following embodiments, the upper conductive layer is made of one of Cu, Al, Au, Ti or a compound thereof. In one or more of the foregoing or following embodiments, the insulating material includes one or more of silicon oxide, SiON, SiOC, SiOCN or SiCN. In one or more of the foregoing or following embodiments, the insulating material includes an organic resin. In one or more of the foregoing or following embodiments, one or more conductive layers includes a first layer and a second layer disposed over the first layer and made of a different material from the first layer. In one or more of the foregoing or following embodiments, the first and second layers are made of one of Cu, Al, Au, Ti or a compound thereof.

In accordance with another aspect of the present disclosure, in a method of manufacturing a semiconductor device, a circuit structure is prepared over a substrate, a passivation layer is formed over the circuit structure, one or more conductive patterns are formed in the passivation layer, one or more conductive layers are formed over the passivation layer, a trench pattern is formed by patterning the one or more conductive layers, an isolation structure is formed by filling the trench pattern with an insulating material, an upper conductive layer is formed over the one or more conductive layers and the isolation structure, and a first metal pad and a second metal pad are formed by patterning the upper conductive layer. The first metal pad is disposed over the isolation structure and isolated from the second metal pad. In one or more of the foregoing or following embodiments, the trench pattern has a ring or a frame shape in plan view. In one or more of the foregoing or following embodiments, no isolation structure is disposed in the one or more conductive layers below the second metal pad. In one or more of the foregoing or following embodiments, a part of the isolation structure is exposed from the first metal pad. In one or more of the foregoing or following embodiments, the upper conductive layer is made of one of Cu, Al, Au, Ti or a compound thereof. In one or more of the foregoing or following embodiments, the insulating material includes one or more of silicon oxide, SiON, SiOC, SiOCN, SiCN or polyimide. In one or more of the foregoing or following embodiments, the passivation layer includes one or more of silicon nitride, SiON, SiOCN or SiCN. In one or more of the foregoing or following embodiments, the trench pattern is formed by patterning the one or more conductive layers and the passivation layer.

In accordance with another aspect of the present disclosure, in a method of manufacturing a semiconductor device, a circuit structure is prepared over a substrate, one or more conductive layers are formed over the circuit structure, a trench pattern is formed by patterning the one or more conductive layers, an isolation structure is formed by filling the trench pattern with an insulating material, an upper conductive layer is formed over the one or more conductive layers and the isolation structure, a first metal pad and a second metal pad are formed by patterning the upper conductive layer. The first metal pad is disposed over the isolation structure and the first metal pad is electrically isolated from the second metal pad. A micro-electro mechanical system is attached over the first and second metal pads. In one or more of the foregoing or following embodiments, the first metal pad is electrically connected to a transistor in the circuit structure. In one or more of the foregoing or following embodiments, the second metal pad is electrically connected to a ground potential.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

preparing a circuit structure over a substrate;

forming one or more conductive layers over the circuit structure;

forming a trench pattern by patterning the one or more conductive layers, wherein the trench pattern includes a ring or a frame shape in plan view;

depositing an insulating material over the one or more conductive layers and within the trench pattern;

planarizing the insulating material to remove portions of the insulating material over the one or more conductive layers while retaining an isolation structure including the insulating material within the trench pattern, wherein the isolation structure includes the ring or the frame shape in plan view;

forming an upper conductive layer over the one or more conductive layers and the isolation structure;

forming a first metal pad and a second metal pad by patterning the upper conductive layer, wherein the first metal pad is disposed over the isolation structure and the first metal pad is electrically isolated from the second metal pad; and attaching a micro-electro mechanical system over the first and second metal pads.

2. The method of claim 1, wherein the first metal pad is electrically connected to a transistor in the circuit structure.

3. The method of claim 1, wherein the second metal pad is electrically connected to a ground potential.

4. A method of manufacturing a semiconductor device, comprising:

preparing a circuit structure over a substrate;

forming one or more conductive layers over the circuit structure;

forming a trench pattern by patterning the one or more conductive layers, wherein the trench pattern includes a ring or a frame shape in plan view;

depositing an insulating material over the one or more conductive layers and within the trench pattern;

planarizing the insulating material to remove portions of the insulating material over the one or more conductive layers while retaining an isolation structure including the insulating material within the trench pattern, wherein the isolation structure includes the ring or the frame shape in plan view;

forming an upper conductive layer over the one or more conductive layers and the isolation structure; and forming a first metal pad by patterning the upper conductive layer so that the first metal pad is disposed over the isolation structure.

5. The method of claim 4, further comprising increasing a thickness of the first metal pad.

6. The method of claim 5, wherein the thickness of the first metal pad is increased by:

forming a mask pattern over the one or more conductive layers having an opening over the first metal pad; and forming an additional layer over the first metal pad by electroplating.

7. The method of claim 4, wherein the upper conductive layer is made of one of Cu, Al, Au, Ti, or a compound thereof.

8. The method of claim 4, wherein the insulating material includes one or more of silicon oxide, SiON, SiOC, SiOCN, or SiCN.

9. The method of claim 4, wherein the insulating material includes an organic resin.

10. The method of claim 4, wherein the one or more conductive layers includes a first layer and a second layer disposed over the first layer and made of a different material from the first layer.

11. The method of claim 10, wherein the first and second layers are made of one of Cu, Al, Au, Ti, or a compound thereof.

12. A method of manufacturing a semiconductor device, comprising:

preparing a circuit structure over a substrate;

forming a passivation layer over the circuit structure;

forming one or more conductive patterns in the passivation layer;

forming one or more conductive layers over the passivation layer;

forming a trench pattern by patterning the one or more conductive layers, wherein the trench pattern includes a ring or a frame shape in plan view;

depositing an insulating material over the one or more conductive layers and within the trench pattern;

planarizing the insulating material to remove portions of the insulating material over the one or more conductive layers while retaining an isolation structure including the insulating material within the trench pattern, wherein the isolation structure includes the ring or the frame shape in plan view;

forming an upper conductive layer over the one or more conductive layers and the isolation structure; and forming a first metal pad and a second metal pad by patterning the upper conductive layer, wherein the first metal pad is disposed over the isolation structure and isolated from the second metal pad.

13. The method of claim 12, wherein no isolation structure is disposed in the one or more conductive layers below the second metal pad.

14. The method of claim 12, wherein a part of the isolation structure is exposed from the first metal pad.

15. The method of claim 12, wherein the upper conductive layer is made of one of Cu, Al, Au, Ti or a compound thereof.

16. The method of claim 12, wherein the insulating material includes one or more of silicon oxide, SiON, SiOC, SiOCN, SiCN, or polyimide.

17. The method of claim 12, wherein the passivation layer includes one or more of silicon nitride, SiON, SiOCN, or SiCN.

18. The method of claim 12, wherein the trench pattern is formed by patterning the one or more conductive layers and the passivation layer.

19. The method of claim 12, wherein, along a cross-section through the substrate and the first and second metal pads, a width of the one or more conductive patterns is less than a width of the one or more conductive layers.

20. The method of claim 19, wherein, along the cross-section, a distance between opposing inner sides of the ring or the frame shape of the isolation structure is greater than the width of the one or more conductive patterns.

* * * * *